United States Patent
Oki et al.

(10) Patent No.: US 8,917,753 B2
(45) Date of Patent: Dec. 23, 2014

(54) ALIGNMENT METHOD OF SEMICONDUCTOR OPTICAL AMPLIFIER AND LIGHT OUTPUT DEVICE

(75) Inventors: Tomoyuki Oki, Kanagawa (JP); Rintaro Koda, Tokyo (JP); Masaru Kuramoto, Kanagawa (JP); Takao Miyajima, Kanagawa (JP); Hiroyuki Yokoyama, Miyagi (JP)

(73) Assignees: Sony Corporation, Tokyo (JP); Tohoku University, Miyaki (JP)

( * ) Notice: Subject to any disclaimer, the term of this patent is extended or adjusted under 35 U.S.C. 154(b) by 306 days.

(21) Appl. No.: 13/163,251

(22) Filed: Jun. 17, 2011

(65) Prior Publication Data
US 2012/0002696 A1 Jan. 5, 2012

(30) Foreign Application Priority Data
Jun. 30, 2010 (JP) ................. 2010-149344

(51) Int. Cl.
*H01S 5/00* (2006.01)
(Continued)

(52) U.S. Cl.
CPC ............... *H01S 5/50* (2013.01); *H01S 5/0657* (2013.01); *H01S 5/1003* (2013.01); *H01S 5/4006* (2013.01); *H01S 5/34333* (2013.01); *H01S 5/1014* (2013.01); *H01S 5/0601* (2013.01); *H01S 5/0625* (2013.01); *B82Y 20/00* (2013.01); *H01S 5/028* (2013.01); *H01S 5/141* (2013.01)
USPC ............ 372/50.22; 372/18; 372/107

(58) Field of Classification Search
USPC ........................ 372/18, 107, 50.22
See application file for complete search history.

(56) References Cited

U.S. PATENT DOCUMENTS 5,014,280 A * 5/1991 Sanada et al. .......... 372/45.01
5,471,335 A 11/1995 Nitta
(Continued)

FOREIGN PATENT DOCUMENTS

| JP | HEI 01-293588 | 11/1989 |
| JP | 05-075212 | 3/1993 |

(Continued)

OTHER PUBLICATIONS

Hiroyuki Yokoyama et al.; Generation of subpicosecond coherent optical pulses by passive mode locking of an AlGaAs diode laser; Applied Physics Letters; 40(2); Jan. 15, 1982.

(Continued)

*Primary Examiner* — Yuanda Zhang
(74) *Attorney, Agent, or Firm* — Dentons US LLP

(57) ABSTRACT

Provided is an alignment method of a semiconductor optical amplifier with which optimization of coupling efficiency between incident laser light and light waveguide of the semiconductor optical amplifier is enabled without depending on an external monitoring device. The alignment method of a semiconductor optical amplifier is a method that optically amplifies laser light from a laser light source and outputs the optically amplified laser light, which adjusts relative position of the semiconductor optical amplifier with respect to the laser light entering into the semiconductor optical amplifier by flowing a given value of current to the semiconductor optical amplifier while entering the laser light from the laser light source to the semiconductor optical amplifier so that a voltage applied to the semiconductor optical amplifier becomes the maximum.

14 Claims, 24 Drawing Sheets

(51) Int. Cl.
   *B82Y 20/00*    (2011.01)
   *H01S 5/50*     (2006.01)
   *H01S 5/14*     (2006.01)
   H01S 5/065      (2006.01)
   H01S 5/10       (2006.01)
   H01S 5/40       (2006.01)
   H01S 5/343      (2006.01)
   H01S 5/06       (2006.01)
   H01S 5/0625     (2006.01)
   H01S 5/028      (2006.01)

(56) References Cited

U.S. PATENT DOCUMENTS

| | | | |
|---|---|---|---|
| 6,124,966 A * | 9/2000 | Yokoyama | 359/339 |
| 6,653,662 B2 * | 11/2003 | Otsuka et al. | 257/99 |
| 6,661,569 B2 | 12/2003 | Yoon et al. | |
| 2002/0075558 A1 * | 6/2002 | Kim et al. | 359/332 |
| 2008/0298417 A1 * | 12/2008 | Atkins et al. | 372/50.22 |
| 2010/0272134 A1 * | 10/2010 | Blanding et al. | 372/22 |

FOREIGN PATENT DOCUMENTS

| | | |
|---|---|---|
| JP | 2000-269597 | 9/2000 |
| JP | 2003-133651 | 5/2003 |
| JP | 2010-014896 | 1/2010 |

OTHER PUBLICATIONS

S. Gee and J. E. Bowers; Ultraviolet picosecond optical pulse generation from a mode-locked InGaN laser diode; Applied Physics Letters; vol. 79, No. 13; Sep. 24, 2001.

Chinese Office Examination Report issued in connection with related Chinese patent application No. CN 201110185443.9 dated Aug. 18, 2014.

* cited by examiner

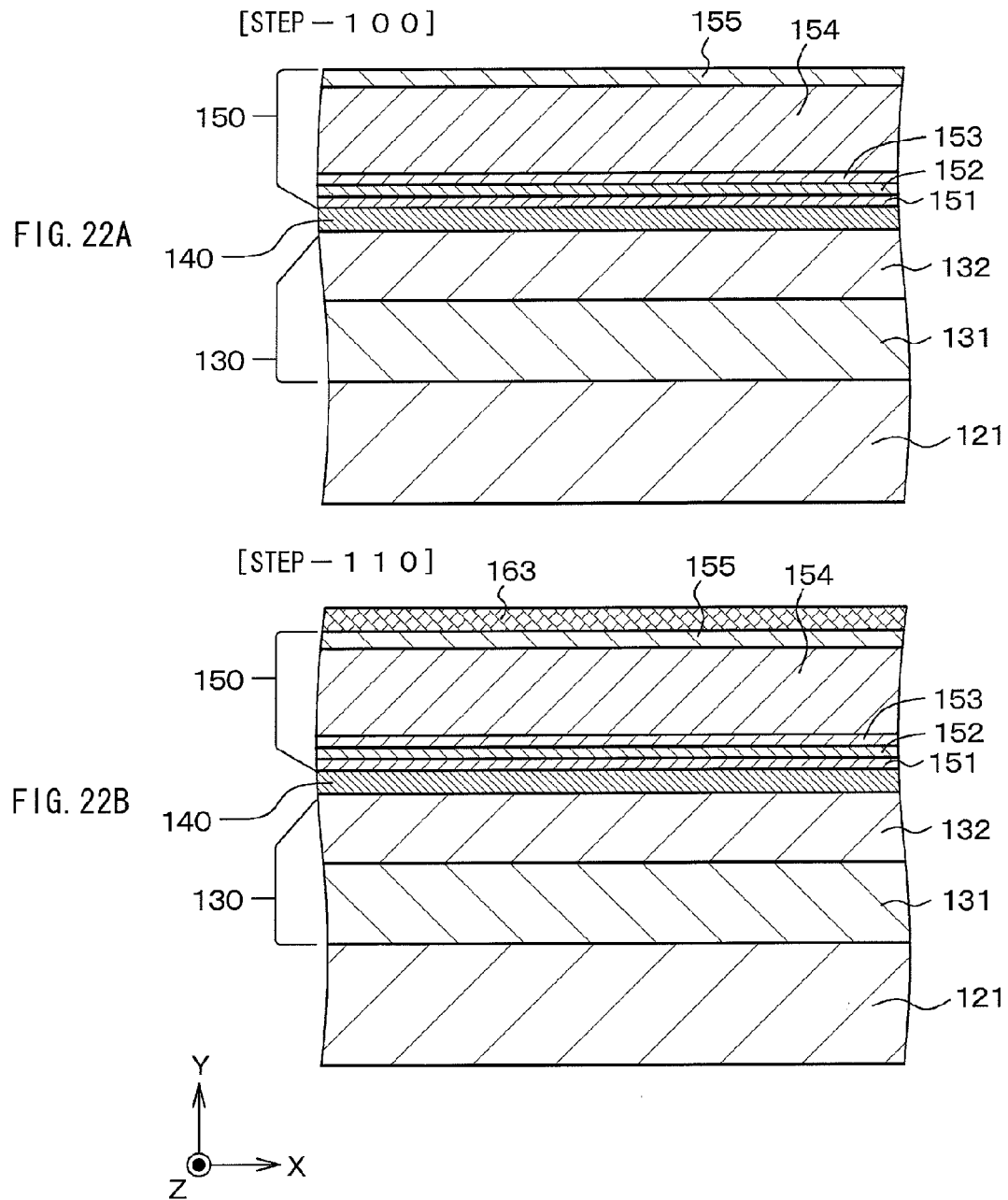

ALIGNMENT METHOD OF SEMICONDUCTOR OPTICAL AMPLIFIER AND LIGHT OUTPUT DEVICE

BACKGROUND OF THE INVENTION

1. Field of the Invention

The present invention relates to an alignment method of a semiconductor optical amplifier and a light output device.

2. Description of the Related Art

In these days, in the advanced scientific region researches using laser light with the pulse time on the attosecond time scale or on the femtosecond time scale, the ultrashort pulse and ultrahigh power laser is actively used. Further, the high power and ultrashort pulse laser diode device that is composed of GaN compound semiconductor and that has light emitting wavelength of 405 nm band has been expected to be a light source for a volumetric optical disc system expected as a next generation optical disc system displacing the blu-ray optical disc system or has been expected to be a light source demanded in the medical field, the bio imaging field and the like.

As the ultrashort pulse and ultrahigh power laser, for example, titanium/sapphire laser is known. Such titanium/sapphire laser is an expensive and large solid laser light source, which is a main factor to inhibit spread of the technology. If the ultrashort pulse and ultrahigh power laser is realized with the use of a laser diode or a laser diode device, significant miniaturization, price reduction, and high stability are able to be realized, which is expected to become a breakthrough for promoting its wide usage in these fields.

Meanwhile, short pulsation of the laser diode device has been actively researched since 1960s in the communication system field. As a method of generating short pulses in the laser diode device, gain switching method, loss switching method (Q switching method), and mode locking method are known. In these methods, high output is pursued by combining the laser diode device with a semiconductor amplifier, a nonlinear optical device, an optical fiber and the like. The mode locking is further categorized into active mode locking and passive mode locking. To generate light pulses based on the active mode locking, an external resonator is configured by using a mirror or a lens, and further high frequency (RF) modulation is added to the laser diode device. Meanwhile, in the passive mode locking, light pulses are able to be generated by simple direct current drive by using a laser diode device having a multiple electrode structure.

In the laser light source, obtaining high power is a big challenge. As a means for amplifying light from the laser light source, the semiconductor optical amplifier (SOA) has been keenly examined. The optical amplifier is an amplifier that directly amplifies an optical signal in a state of light without converting the optical signal to an electric signal. The optical amplifier has a laser structure with no resonator, and amplifies incident light by light gain of the amplifier. Light output from the semiconductor optical amplifier is largely changed according to coupling efficiency between incident laser light and a light waveguide of the semiconductor optical amplifier. Thus, to attain high light amplification ratio in the semiconductor optical amplifier, alignment between the incident laser light and the semiconductor optical amplifier is significantly important. Further, monitoring the coupling efficiency is also a big challenge.

SUMMARY OF THE INVENTION

To address the foregoing challenge, for example, in the technique disclosed in Japanese Unexamined Patent Application Publication No. 2003-133651, light output not based on coupling between incident laser light and a light waveguide of a semiconductor optical amplifier is monitored. Further, for example, in the technique disclosed in Japanese Unexamined Patent Application Publication No. 2010-014896, light output from a semiconductor optical amplifier is monitored. However, in both techniques, since light output is monitored, in the case where alignment between the incident laser light and the semiconductor optical amplifier is made, it is not possible to exclude influence of misalignment, change or the like of a light path used for monitoring the light output. Further, in the case where monitoring the light output is changed, it is not possible to determine whether or not such a change is caused by misalignment between the incident laser light and the semiconductor optical amplifier or is caused by a change of the light path used for monitoring the light output.

Accordingly, in the invention, it is desirable to provide an alignment method of a semiconductor optical amplifier with which optimization of coupling efficiency between incident laser light and light waveguide of the semiconductor optical amplifier is enabled without depending on an external monitoring device and a light output device suitable for executing the alignment method of a semiconductor optical amplifier.

According to a first embodiment of the invention, there is provided an alignment method of a semiconductor optical amplifier that optically amplifies laser light from a laser light source and outputs the optically amplified laser light, which adjusts relative position of the semiconductor optical amplifier with respect to the laser light entering into the semiconductor optical amplifier by flowing a given value of current to the semiconductor optical amplifier while entering the laser light from the laser light source to the semiconductor optical amplifier so that a voltage applied to (added to) the semiconductor optical amplifier becomes the maximum.

According to a second embodiment of the invention, there is provided an alignment method of a semiconductor optical amplifier that optically amplifies laser light from a laser light source and outputs the optically amplified laser light, which adjusts relative position of the semiconductor optical amplifier with respect to the laser light entering into the semiconductor optical amplifier by applying a given value of voltage to the semiconductor optical amplifier while entering the laser light from the laser light source to the semiconductor optical amplifier so that a current flowing in the semiconductor optical amplifier becomes the maximum.

According to a first embodiment and a second embodiment of the invention, there is provided a light output device including: a laser light source; a semiconductor optical amplifier that optically amplifies laser light from the laser light source and outputs the optically amplified light; an alignment device that adjusts relative position of the semiconductor optical amplifier with respect to the laser light entering into the semiconductor optical amplifier; and a semiconductor optical amplifier control device that controls operation of the semiconductor optical amplifier.

In the light output device according to the first embodiment of the invention, a given value of current is flown to the semiconductor optical amplifier while entering laser light into the semiconductor optical amplifier from the laser light source, a voltage applied to (added to) the semiconductor optical amplifier is monitored by the semiconductor optical amplifier control device, and the relative position of the semiconductor optical amplifier with respect to the laser light entering into the semiconductor optical amplifier is adjusted so that the voltage applied to (added to) the semiconductor optical amplifier becomes the maximum by the alignment device.

In the light output device according to the second embodiment of the invention, a given value of voltage is applied to the semiconductor optical amplifier while entering laser light into the semiconductor optical amplifier from the laser light source, a current flown in the semiconductor optical amplifier is monitored by the semiconductor optical amplifier control device, and the relative position of the semiconductor optical amplifier with respect to the laser light entering into the semiconductor optical amplifier is adjusted so that the current flown in the semiconductor optical amplifier becomes the maximum by the alignment device.

In the alignment method of a semiconductor optical amplifier according to the first embodiment or the second embodiment of the invention and in the light output device according to the first embodiment or the second embodiment of the invention, the voltage applied to the semiconductor optical amplifier and the current flown in the semiconductor optical amplifier are measured in order to adjust the relative position of the semiconductor optical amplifier with respect to the laser light entering into the semiconductor optical amplifier. Thus, measurement for position adjustment is able to be made without depending on an external monitoring device. Therefore, the relative position of the semiconductor optical amplifier with respect to laser light entering into the semiconductor optical amplifier is able to be adjusted accurately.

Other and further objects, features and advantages of the invention will appear more fully from the following description.

BRIEF DESCRIPTION OF THE DRAWINGS

FIGS. 22A and 22B are schematic partial cross sectional views of a substrate and the like for explaining a method of manufacturing the mode locking laser diode device in the first example.

DETAILED DESCRIPTION OF THE PREFERRED EXAMPLES

Figure 1:
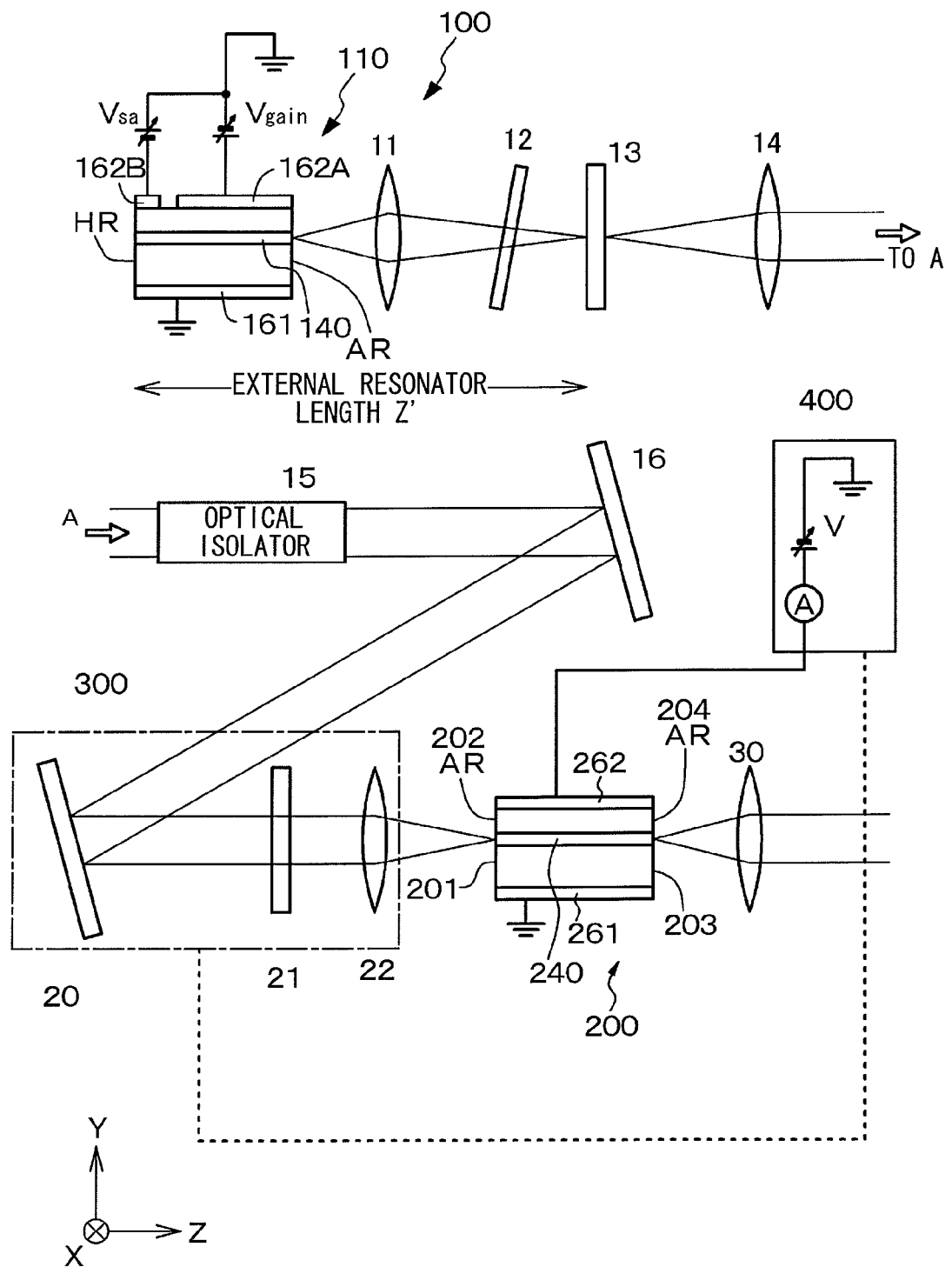
FIG. 1 is a conceptual view of a light output device of a first example.

While the invention will be hereinafter described based on examples with reference to the drawings, the invention is not limited to the examples, and various numerical values and materials in the examples are exemplification. The description will be given in the following order:
1. Alignment methods of a semiconductor optical amplifier according to a first embodiment and a second embodiment of the invention, light output devices according to a first embodiment and a second embodiment of the invention, and overall description
2. First example (the alignment method of a semiconductor optical amplifier according to the first embodiment of the invention and the light output device according to the first embodiment of the invention)
3. Second example (modification of the first example)
4. Third example (the alignment method of a semiconductor optical amplifier according to the second embodiment of the invention and the light output device according to the second embodiment of the invention)
5. Fourth example (modification of the third example)
6. Fifth example (another modification of the third example)
7. Sixth example (modification of the mode locking laser diode device in the first example)
8. Seventh example (another modification of the mode locking laser diode device in the first example)
9. Eighth example (another modification of the mode locking laser diode device in the first example)
10. Ninth example (another modification of the mode locking laser diode device in the first example)
11. Tenth example (another modification of the mode locking laser diode device in the first example) and others Alignment methods of a semiconductor optical amplifier according to a first embodiment and a second embodiment of the invention, light output devices according to a first embodiment and a second embodiment of the invention, and overall description In a light output device according to a first embodiment of the invention, resolution of a voltage monitor in a semiconductor optical amplifier control device is desirably 1 millivolt or less, and is preferably 0.1 millivolt or less. Further, in a light output device according to a second embodiment of the invention, resolution of a current monitor in a semiconductor optical amplifier control device is desirably 100 microampere or less, and is preferably 10 microampere or less.

In the light output device according to the first embodiment of the invention or an alignment method of a semiconductor optical amplifier according to a first embodiment of the invention (hereinafter collectively referred to as "the first embodiment of the invention" in some cases), in the case where light output of laser light outputted from a semiconductor amplifier is measured and the light output is changed from a desired value, relative position of the semiconductor optical amplifier with respect to the laser light entering the semiconductor optical amplifier may be readjusted by flowing a given value of current to the semiconductor optical amplifier while entering laser light from a laser light source to the semiconductor optical amplifier so that a voltage applied to (added to) the semiconductor optical amplifier becomes the maximum. In such a preferred form, in the case where result of the readjustment of the relative position of the semiconductor optical amplifier with respect to the laser light entering the semiconductor optical amplifier is the same as the relative position of the semiconductor optical amplifier with respect to the laser light entering the semiconductor optical amplifier before the readjustment, light path through which the laser light outputted from the semiconductor optical amplifier passes may be adjusted. By adopting such a form, in the case where a monitor of light output is changed, it is able to easily determine whether or not such change is caused by relative position change of the semiconductor optical amplifier with respect to the laser light entering the semiconductor optical amplifier (that is, change of coupling efficiency between the incident laser light and light waveguide of the semiconductor optical amplifier). Further, in the first embodiment of the invention, the semiconductor optical amplifier may include: a laminated structure in which a first compound semiconductor layer that has a first conductivity type and is composed of GaN compound semiconductor, a third compound semiconductor layer that has a light amplification region (carrier injection region and gain region) composed of GaN compound semiconductor, and a second compound semiconductor layer that has a second conductivity type different from the first conductivity type and is composed of GaN compound semiconductor are sequentially layered; a second electrode formed on the second compound semiconductor layer; and a first electrode electrically connected to the first compound semiconductor layer.

In the light output device according to the second embodiment of the invention or an alignment method of a semiconductor optical amplifier according to a second embodiment of the invention (hereinafter collectively referred to as "the second embodiment of the invention" in some cases), in the case where light output of laser light outputted from a semiconductor amplifier is measured and the light output is changed from a desired value, relative position of the semiconductor optical amplifier with respect to the laser light entering the semiconductor optical amplifier may be readjusted by applying a given value of voltage to the semiconductor optical amplifier while entering laser light from a laser light source to the semiconductor optical amplifier so that a current flown in the semiconductor optical amplifier becomes the maximum. In such a preferred form, in the case where result of the readjustment of the relative position of the semiconductor optical amplifier with respect to the laser light entering the semiconductor optical amplifier is the same as the relative position of the semiconductor optical amplifier with respect to the laser light entering the semiconductor optical amplifier before the readjustment, light path through which the laser light outputted from the semiconductor optical amplifier passes may be adjusted. By adopting such a form, in the case where a monitor of light output is changed, it is able to easily determine whether or not such change is caused by relative position change of the semiconductor optical amplifier with respect to the laser light entering the semiconductor optical amplifier (that is, change of coupling efficiency between the incident laser light and light waveguide of the semiconductor optical amplifier). Further, in the second embodiment of the invention, the semiconductor optical amplifier may include: a laminated structure in which a first compound semiconductor layer that has a first conductivity type and is composed of GaN compound semiconductor, a third compound semiconductor layer that has a light amplification region (carrier injection region and gain region) composed of GaN compound semiconductor, and a second compound semiconductor layer that has a second conductivity type different from the first conductivity type and is composed of GaN compound semiconductor are sequentially layered; a second electrode formed on the second compound semiconductor layer; and a first electrode electrically connected to the first compound semiconductor layer. Further, in such a form, the second electrode may be composed of a first section and a second section that is provided on the light output end face side of the semiconductor optical amplifier and is separated from the first section by an isolation trench. In terms of inhibiting deterioration of the light output end face of the semiconductor optical amplifier, the second section is preferably located on the light output end face side of the semiconductor optical amplifier. Further, in such a structure, where the length of the first section is $L_{Amp-1}$ and the length of the second section is $L_{Amp-2}$, $0.001 \leq L_{Amp-2}/L_{Amp-1} \leq 0.01$ is desirably satisfied, and $0.0025 \leq L_{Amp-2}/L_{Amp-1} \leq 0.0075$ is preferably satisfied. A voltage applied to the second section of the second electrode is any of values from −20 volt to 4 volt both inclusive, and is preferably any of values from −15 volt to 0 volt both inclusive. Light amplification as an inherent function of the semiconductor optical amplifier is performed by applying a voltage (by flowing a current) to the first section of the second electrode, while measurement for position adjustment is performed by applying a voltage to the second section of the second electrode. An electric resistance value between the first section and the second section of the second electrode in the semiconductor optical amplifier is desirably $1*10^2 \Omega$ or more, is preferably $1*10^3 \Omega$ or more, and is more preferably $1*10^4 \Omega$ or more. Further, the electric resistance value between the first section and the second section of the second electrode is desirably $1*10$ times or more an electric resistance value between the second electrode and the first electrode, is preferably $1*10^2$ times or more the electric resistance value between the second electrode and the first electrode, and is more preferably $1*10^3$ times or more the electric resistance value between the second electrode and the first electrode. Further, the width of the isolation trench that separates the second electrode into the first section and the second section is desirably 1 μm or more and 50% or less the length of the semiconductor optical amplifier, and is preferably 10 μm or more and 10% or less the length of the semiconductor optical amplifier.

In the first embodiment of the invention or the second embodiment of the invention, by adjusting the relative position of the semiconductor optical amplifier with respect to the laser light entering the semiconductor optical amplifier, light output of laser light outputted from the semiconductor optical amplifier may become the maximum.

Further, in the first embodiment of the invention or the second embodiment of the invention, the semiconductor optical amplifier may be composed of a transmissive semiconductor optical amplifier, but is not limited thereto. For example, the semiconductor optical amplifier may be composed of a reflective semiconductor optical amplifier, a resonant semiconductor optical amplifier, or a monolithic semiconductor optical amplifier.

Further, in the first embodiment of the invention or the second embodiment of the invention, the laser light source may be composed of a mode locking laser diode device, and pulse laser light outputted from the mode locking laser diode device may enter the semiconductor optical amplifier. In this case, the laser light source may output pulse laser light based on mode locking operation. However, the laser light source is not limited thereto. A known continuous oscillation laser light source, known various types of pulse oscillation laser light sources such as a gain switching laser light source and a loss switching laser light source (Q switching laser light source), and a laser light source such as a titanium sapphire laser are able to be used. The semiconductor optical amplifier in the invention is an amplifier that directly amplifies an optical signal in a state of light without converting the optical signal to an electric signal. The semiconductor optical amplifier in the invention has a laser structure excluding resonator effect as much as possible, and amplifies incident light by light gain of the semiconductor optical amplifier. That is, the semiconductor optical amplifier in the invention may substantially have the same composition and the same structure as those of the laser diode device configuring the laser light source in the invention, and may have a composition and a configuration different from those of the laser diode device configuring the laser light source in the invention.

In the alignment method of a semiconductor optical amplifier according to the first embodiment of the invention, when a voltage applied to (added to) the semiconductor optical amplifier in the case where a given value of current $I_0$ is flown to the semiconductor optical amplifier while laser light does not enter the semiconductor optical amplifier from the laser light source is $V_1$, and a voltage applied to (added to) the semiconductor optical amplifier in the case where a given value of current $I_0$ is flown to the semiconductor optical amplifier while laser light enters the semiconductor optical amplifier from the laser light source is $V_2$, the relative position of the semiconductor optical amplifier with respect to the laser light entering the semiconductor optical amplifier may be adjusted so that value of $\Delta V = (V_2 - V_1)$ becomes the maximum.

Further, in the alignment method of a semiconductor optical amplifier according to the second embodiment of the invention, when a current flown in the semiconductor optical amplifier in the case where a given value of voltage $V_0$ is applied to the semiconductor optical amplifier while laser light does not enter the semiconductor optical amplifier from the laser light source is $I_1$, and a current flown in the semiconductor optical amplifier in the case where a given value of voltage $V_0$ is applied to the semiconductor optical amplifier while laser light enters the semiconductor optical amplifier from the laser light source is $I_2$, the relative position of the semiconductor optical amplifier with respect to the laser light entering the semiconductor optical amplifier may be adjusted so that value of $\Delta I = (I_2 - I_1)$ becomes the maximum.

In the light output device according to the first embodiment of the invention, when a voltage applied to (added to) the semiconductor optical amplifier in the case where a given value of current $I_0$ is flown to the semiconductor optical amplifier while laser light does not enter the semiconductor optical amplifier from the laser light source is $V_1$, and a voltage applied to (added to) the semiconductor optical amplifier in the case where a given value of current $I_0$ is flown to the semiconductor optical amplifier while laser light enters the semiconductor optical amplifier from the laser light source is $V_2$, the relative position of the semiconductor optical amplifier with respect to the laser light entering the semiconductor optical amplifier may be adjusted so that value of $\Delta V = (V_2 - V_1)$ becomes the maximum by an alignment device.

Further, in the light output device according to the second embodiment of the invention, when a current flown in the semiconductor optical amplifier in the case where a given value of voltage $V_0$ is applied to the semiconductor optical amplifier while laser light does not enter the semiconductor optical amplifier from the laser light source is $I_1$, and a current flown in the semiconductor optical amplifier in the case where a given value of voltage $V_0$ is applied to the semiconductor optical amplifier while laser light enters the semiconductor optical amplifier from the laser light source is $I_2$, the relative position of the semiconductor optical amplifier with respect to the laser light entering the semiconductor optical amplifier may be adjusted so that value of $\Delta I=(I_2-I_1)$ becomes the maximum by an alignment device.

As a given value of current in the first embodiment of the invention, 0 milliampere$<\Delta I \leq 20$ milliampere is able to be exemplified. As a given value of voltage in the second embodiment of the invention, 0 volt$<\Delta V \leq 5$ volt is able to be exemplified Specific examples of methods of relative position adjustment of the semiconductor optical amplifier with respect to the laser light entering the semiconductor optical amplifier include a method in which the semiconductor optical amplifier is placed on, for example, an XYZ stage and the XYZ stage is moved and a method in which a part (for example, a reflecting mirror) composing a light path through which the laser light entering the semiconductor optical amplifier passes is placed on, for example, the XYZ stage and the XYZ stage is moved. Specific adjustment examples of the light path through which the laser light outputted from the semiconductor optical amplifier passes include a method in which a part (for example, a reflecting mirror) composing the light path through which the laser light outputted from the semiconductor optical amplifier passes is placed on, for example, the XYZ stage and the XYZ stage is moved. Measurement of the light output of the laser light outputted from the semiconductor optical amplifier may be performed based on a method using photodiode or a method in which a current amount flowing in the photodiode is corrected and is converted to light power. As a desired value $P_0$ of light output, 0 milliwatt$<P_0 \leq 1$ watt is able to be exemplified. Specific structures of the semiconductor optical amplifier control device include combination of a known DC power source, a voltage measurement device, and a current measurement device and a DC current voltage source.

In the case where the laser light source in the first embodiment of the invention or the second embodiment of the invention (in some cases, hereinafter collectively and simply referred to as "the invention") is composed of the mode locking laser diode device as described above, the mode locking laser diode device (hereinafter referred to as "mode locking laser diode device in the invention") may include: a laminated structure in which a first compound semiconductor layer that has a first conductivity type and is composed of GaN compound semiconductor, a third compound semiconductor layer that has a light emitting region composed of GaN compound semiconductor, and a second compound semiconductor layer that has a second conductivity type different from the first conductivity type and is composed of GaN compound semiconductor are sequentially layered; a second electrode formed on the second compound semiconductor layer; and a first electrode electrically connected to the first compound semiconductor layer. The laminated structure may be formed on a compound semiconductor substrate having polarity. The third compound semiconductor layer may have a quantum well structure including a well layer and a barrier layer. In addition, though not limited, the thickness of the well layer is from 1 nm to 10 nm both inclusive, and is preferably from 1 nm to 8 nm both inclusive. The impurity doping concentration of the barrier layer is from $2*10^{18}$ cm$^{-3}$ to $1*10^{20}$ cm$^{-3}$ both inclusive, and is preferably from $1*10^{19}$ cm$^{-3}$ to $1*10^{20}$ cm$^{-3}$ both inclusive.

In driving the mode locking laser diode device in the invention, light pulse may be generated in the light emitting region by flowing a current from the second electrode to the first electrode through the laminated structure. Further, in the mode locking laser diode device in the invention, light pulse may be generated in the light emitting region by flowing a current from the second electrode to the first electrode through the laminated structure.

To enable self-pulsation operation of the laser diode device, the light emitting region and a saturable absorption region should be provided for the laser diode device. Based on arrangement state of the light emitting region and the saturable absorption region, the laser diode device is able to be generally categorized into SAL (saturable absorber layer) type or WI (weakly index guide) type in which the light emitting region and the saturable absorption region are arranged in vertical direction and multielectrode type including bisection type in which the light emitting region and the saturable absorption region are arranged in line in the resonator direction. In the mode locking method, in a cubic (mainly GaAs) laser diode device, it has been confirmed that light pulse with time width of 0.6 psec is able to be generated (see "Appl. Phys. Lett. 39 (1981) 525," H. Yokoyama, et al). Further, in the hexagonal crystal (mainly GaN) laser diode device, S. Gee et al firstly reported generation of light pulse by using mode locking method in 2001 (see "Appl. Phys. Lett. 79 (2001) 1951," S. Gee and J. E. Bowers). However, according to "Appl. Phys. Lett. 79 (2001) 1951," the time width of light pulse is 30 psec, which is still long. Further, in the case where the multielectrode laser diode device is fabricated by using a substrate having polarity, specifically, for example, in the case where a multielectrode GaN laser diode device is provided on {0001} plane (C plane) of a GaN substrate, in some cases, saturable absorption is difficult to be controlled electrically due to QCSE effect (quantum confinement Stark effect) by internal electric field resulting from piezoelectric polarization or intrinsic polarization. That is, it has been found that in some cases, it is necessary to increase a DC current value flown to the first electrode for obtaining self-pulsation operation and mode locking operation and reverse bias voltage value applied to the saturable absorption region, subpulse component associated with main pulse is generated, or synchronization is difficult to be obtained between an external signal and light pulse.

In the mode locking laser diode device in the invention, it is preferable that the thickness of the well layer composing the third compound semiconductor layer is defined as a value from 1 nm to 10 nm both inclusive, and the impurity doping concentration of the barrier layer composing the third compound semiconductor layer is defined as a value from $2*10^{18}$ cm$^{-3}$ to $1*10^{20}$ cm$^{-3}$ both inclusive. That is, the thickness of the well layer is decreased, and carrier of the third compound semiconductor layer is increased. In the result, influence of piezoelectric polarization is able to be decreased, and a laser light source capable of generating single-peaked light pulse that has a short time width and small subpulse component is able to be obtained. Further, mode locking drive is able to be attained by low reverse bias voltage, and light pulse train in synchronization with an external signal (electric signal and optical signal) is able to be generated. Accordingly, the mode locking laser diode device in the invention is applicable as an oscillator that generates light pulse in a volumetric optical disc system, for example.

In the mode locking laser diode device in the invention, the third compound semiconductor layer may further include the saturable absorption region, and the second electrode may be separated into the first section for obtaining forward bias state by flowing a current to the first electrode through the light emitting region and the second section for adding electric field to the saturable absorption region by the isolation trench. The forward bias state may be obtained by flowing a current from the first section of the second electrode to the first electrode through the light emitting region, and electric field may be added to the saturable absorption region by applying a voltage between the first electrode and the second section of the second electrode.

It is desirable that a reverse bias voltage is applied between the first electrode and the second section (that is, the first electrode is a cathode and the second section is an anode). A pulse current or a pulse voltage in synchronization with a pulse current or a pulse voltage applied to the first section of the second electrode may be applied to the second section of the second electrode, or a DC bias may be applied to the second section of the second electrode.

Further, in the mode locking laser diode device in the invention, the electric resistance value between the first section and the second section of the second electrode is desirably $1*10^2\Omega$ or more, is preferably $1*10^3\Omega$ or more, and is more preferably $1*10^4\Omega$ or more. Further, the electric resistance value between the first section and the second section of the second electrode is desirably $1*10$ times or more the electric resistance value between the second electrode and the first electrode, is preferably $1*10^2$ times or more the electric resistance value between the second electrode and the first electrode, and is more preferably $1*10^3$ times or more the electric resistance value between the second electrode and the first electrode.

In the case where the electric resistance value between the first section and the second section of the second electrode is $1*10^2\Omega$ or more, or the electric resistance value between the first section and the second section of the second electrode is 10 times or more the electric resistance value between the second electrode and the first electrode, flow of leakage current from the first section to the second section of the second electrode is able to be inhibited securely. That is, a current injected to the light emitting region (carrier injection region, gain region) is able to be increased. At the same time, reverse bias voltage $V_{sa}$ applied to the saturable absorption region (carrier non-injection region) is able to be increased. In the result, single mode self-pulsation operation having light pulse with strong peak power is able to be attained. In addition, such a high electric resistance value between the first section and the second section of the second electrode is able to be attained only by separating the second electrode into the first section and the second section by the isolation trench. That is, generation of light pulse by mode locking is able to be realized more easily.

Further, in the mode locking laser diode device in the invention, the width of the isolation trench that separates the second electrode into the first section and the second section is desirably 1 μm or more and 50% or less the resonator length, and is preferably 10 μm or more and 10% or less the resonator length. As the resonator length, though 0.3 mm is able to be exemplified. However, the value is not limited thereto. In the following description, the resonator direction is regarded as Z direction and the thickness direction of the laminated structure is regarded as Y direction. Further, the length of the saturable absorption region may be shorter than the length of the light emitting region. Further, the length of the second electrode (total length of the first section and the second section) may be shorter than the length of the third compound semiconductor layer. Examples of arrangement state of the first section and the second section of the second electrode include the following:

(1) state in which two first sections of the second electrode and one second section of the second electrode are provided, an end of the second section is opposed to one first section with one isolation trench in between, and the other end of the second section is opposed to the other first section with the other isolation trench in between (that is, the second electrode has a structure in which the second section is sandwiched between the first sections);

(2) State in which one first section of the second electrode and one second section of the second electrode are provided, and the first section of the second electrode and the second section of the second electrode are arranged with an isolation trench in between; and (3) state in which one first section of the second electrode and two second sections of the second electrode are provided, an end of the first section is opposed to one second section with one isolation trench in between, and the other end of the first section is opposed to the other second section with the other isolation trench in between.

Specially, the structures (1) and (2) are desirable. Further, more generally, examples of arrangement state of the first section and the second section of the second electrode include the following:

(4) state that N pieces of the first sections of the second electrode and (N−1) pieces of the second sections of the second electrode are provided, and the second section of the second electrode is sandwiched between the first sections of the second electrode; and (5) state that N pieces of the second sections of the second electrode and (N−1) pieces of the first sections of the second electrode are provided, and the first section of the second electrode is sandwiched between the second sections of the second electrode.

In other words, the state 4 and state 5 are described as follows:

(4') state that N pieces of light emitting regions [carrier injection region and gain region] and (N−1) pieces of saturable absorption regions [carrier non-injection region] are provided, and the saturable absorption region is sandwiched between the light emitting regions; and (5') state that N pieces of saturable absorption regions [carrier non-injection region] and (N−1) pieces of light emitting regions [carrier injection region and gain region] are provided, and the light emitting region is sandwiched between the saturable absorption regions.

By adopting structures (1), (5), and (5'), damage in the light output end face of the mode locking laser diode device is hardly generated.

Further, in the driving method of the mode locking laser diode device in the invention, it is possible that a current is flown from the second electrode to the first electrode through the light emitting region, and an external electric signal is superimposed on the first electrode from the second electrode through the light emitting region. Thereby, light pulse is able to be sync with the external electric signal. Further, an optical signal may enter from one end face of the laminated structure. Again, thereby the light pulse is able to be sync with the optical signal.

Further, in the semiconductor optical amplifier in the invention or the mode locking laser diode device in the invention, doping impurity for the barrier layer may be silicon (Si). However, doping impurity is not limited thereto. As other doping impurity, oxygen (O) may be adopted.

Further, the semiconductor optical amplifier in the invention or the mode locking laser diode device in the invention may have a ridge stripe type separate confinement heterostructure (SCH structure). Further, the semiconductor optical amplifier in the invention or the mode locking laser diode device in the invention may have an oblique ridge stripe type separate confinement heterostructure. The height of the ridge structure is desirably from 0.1 μm to 10 μm both inclusive, and is preferably from 0.2 μm to 1 μm both inclusive. However, the value thereof is not limited thereto. Further, as the width of the ridge structure, 2 μm or less is able to be exemplified, and as the lower limit value of the width of the ridge structure, for example, 0.8 μm is able to be exemplified. However, the value thereof is not limited thereto. Distance D from the top face of a portion of the second compound semiconductor layer located outside of both side faces of the ridge section to the third compound semiconductor layer is preferably $1.0*10^{-7}$ m (0.1 μm) or more. By defining the distance D as above, the saturable absorption region is able to be securely formed in both sides (X direction) of the third compound semiconductor layer. The upper limit of the distance D may be determined based on threshold current increase, temperature characteristics, deterioration of current increase ratio in long time drive and the like.

The mode locking laser diode device in the invention is, for example, able to be manufactured by the following method. That is, the mode locking laser diode device in the invention is, for example, able to be manufactured by the following manufacturing method including the following respective steps:

(A) step of forming the laminated structure in which the first compound semiconductor layer that has the first conductivity type and is composed of GaN compound semiconductor, the third compound semiconductor layer that has the light emitting region composed of GaN compound semiconductor and the saturable absorption region, and the second compound semiconductor layer that has the second conductivity type different from the first conductivity type and is composed of GaN compound semiconductor are sequentially layered is formed;

(B) subsequent step of forming the strip-shaped second electrode on the second compound semiconductor layer;

(C) subsequent step of etching at least part of the second compound semiconductor layer with the use of the second electrode as an etching mask, and thereby forming the ridge structure; and (D) subsequent step of forming a resist layer for forming the isolation trench in the second electrode, and subsequently forming the isolation trench in the second electrode by wet etching method with the use of the resist layer as a wet etching mask, and thereby separating the second electrode into the first section and the second section by the isolation trench.

The ridge structure is formed by adopting the foregoing manufacturing method, that is, by etching at least part of the second compound semiconductor layer with the use of the strip-shaped second electrode as an etching mask. That is, the ridge structure is formed by self alignment method by using the patterned second electrode as an etching mask. Thus, there is no joint misalignment between the second electrode and the ridge structure. Further, the isolation trench is formed in the second electrode by wet etching method. By adopting wet etching method as described above, deterioration of the optical and electric characteristics of the second compound semiconductor layer is able to be inhibited differently from dry etching method. Accordingly, deterioration of light emitting characteristics is able to be securely prevented.

In the step (C), part of the second compound semiconductor layer may be etched in the thickness direction, all of the second compound semiconductor layer may be etched in the thickness direction, the second compound semiconductor layer and the third compound semiconductor layer may be etched in the thickness direction, or part of the second compound semiconductor layer, the third compound semiconductor layer, and the first compound semiconductor layer may be etched in the thickness direction.

Further, when etching rate of the second electrode is $Er_0$ and etching rate of the laminated structure is $Er_1$ in forming the isolation trench in the second electrode in the foregoing step D, $Er_0/Er_1 \geq 1*10$ is desirably satisfied, and $Er_0/Er_1 \geq 1*10^2$ is preferably satisfied. In the case where $Er_0/Er_1$ satisfies the foregoing relation, the second electrode is able to be securely etched without etching the laminated structure (or if the laminated structure is etched, the etching portion is little.)

The semiconductor optical amplifier in the invention is able to be substantially manufactured by a manufacturing method similar to the manufacturing method of the foregoing mode locking laser diode device in the invention. However, the manufacturing method thereof is not limited thereto.

In the semiconductor optical amplifier in the invention or the mode locking laser diode device in the invention, the second electrode may be composed of a palladium (Pd) single layer, a nickel (Ni) single layer, a platinum (Pt) single layer, or a laminated structure of a palladium layer and a platinum layer in which the palladium layer is contacted with the second compound semiconductor layer, or a laminated structure of a palladium layer and a nickel layer in which the palladium layer is contacted with the second compound semiconductor layer. In the case where the lower metal layer is composed of palladium, and the upper metal layer is composed of nickel, the thickness of the upper metal layer is desirably 0.1 μm or more, and is preferably 0.2 μm or more. Further, the second electrode is preferably composed of the palladium (Pd) single layer. In this case, the thickness thereof is desirably 20 nm or more, and is preferably 50 nm or more. Further, the second electrode is preferably composed of a palladium (Pd) single layer, a nickel (Ni) single layer, a platinum (Pt) single layer, or a laminated structure of a lower metal layer and an upper metal layer in which the lower metal layer is contacted with the second compound semiconductor layer (however, the lower metal layer is composed of one metal selected from the group consisting of palladium, nickel, and platinum; and the upper metal layer is composed of a metal having etching rate in forming the isolation trench in the second electrode in the foregoing step D equal to, similar to, or higher than etching rate of the lower metal layer). Further, an etching liquid used in forming the isolation trench in the second electrode in the foregoing step D is desirably aqua regia, nitric acid, vitriolic acid, muriatic acid, or a mixed liquid composed of at least two types out of these acids (specifically, a mixed liquid composed of nitric acid and vitriolic acid, or a mixed liquid composed of vitriolic acid and muriatic acid). The width of the second electrode is desirably from 0.5 μm to 50 μm both inclusive, and is preferably from 1 μm to 5 μm both inclusive.

In the semiconductor optical amplifier in the invention or the mode locking laser diode device in the invention, specifically, the laminated structure may be composed of AlGaInN compound semiconductor. Specific examples of AlGaInN compound semiconductor include GaN, AlGaN, GaInN, and AlGaInN. Further, such a compound semiconductor may include boron (B) atom, thallium (Tl) atom, arsenic (As) atom, phosphorus (P) atom, or antimony (Sb) atom according to needs. Further, the third compound semiconductor layer configuring a light amplification region or the light emitting region (gain region) and the saturable absorption region (in some cases, the third compound semiconductor layer is referred to as "active layer") has the quantum well structure. Specifically, the third compound semiconductor layer may have single quantum well structure [QW structure], or multiquantum well structure [MQW structure]. The third compound semiconductor layer having the quantum well structure has a structure in which at least one well layer and at least one barrier layer are layered. As a combination of compound semiconductor composing the well layer and compound semiconductor composing the barrier layer, $(In_yGa_{(1-y)}N, GaN)$, $(In_yGa_{(1-y)}N, In_zGa_{(1-z)}N)$ (y>z), and $(In_yGa_{(1-y)}N, AlGaN)$ are able to be exemplified.

Further, in the semiconductor optical amplifier in the invention or the mode locking laser diode device in the invention, the second compound semiconductor layer may have a superlattice structure in which a p-type GaN layer and a p-type AlGaN layer are alternately layered. The thickness of the superlattice structure may be 0.7 μm or less. By adopting such a superlattice structure, while high refractive index necessary as a cladding layer is maintained, a series resistance component of the laser diode device is able to be decreased, leading to realizing a low operation voltage of the laser diode device. Though the lower limit value of the thickness of the superlattice structure is not limited, the lower limit value is, for example, 0.3 μm. As the thickness of the p-type GaN layer composing the superlattice structure, a thickness from 1 nm to 5 nm both inclusive is able to be exemplified. As the thickness of the p-type AlGaN layer composing the superlattice structure, a thickness from 1 nm to 5 nm both inclusive is able to be exemplified. As the total number of layers of the p-type GaN layer and the p-type AlGaN layer, the number from 60 to 300 both inclusive is able to be exemplified. Further, the distance from the third compound semiconductor layer to the second electrode may be 1 μm or less, and preferably 0.6 μm or less. By defining the distance from the third compound semiconductor layer to the second electrode as described above, the thickness of the p-type second compound semiconductor layer having high resistance is able to be decreased, and the operation voltage of the laser diode device is able to be decreased. Though the lower limit value of the distance from the third compound semiconductor layer to the second electrode is not limited, for example, the lower limit value of the distance from the third compound semiconductor layer to the second electrode is 0.3 μm. Further, the second compound semiconductor layer may be doped with Mg at the level of $1*10^{19}$ $cm^{-3}$ or more. The absorption coefficient of the second compound semiconductor layer to light in 405 nm wavelength from the third compound semiconductor layer may be at least 50 $cm^{-1}$. The atom concentration of Mg comes from material physicality that the maximum electron hole concentration is shown at the value of $2*10^{19}$ $cm^{-3}$, and is a result of design that the maximum electron hole concentration, that is, the specific resistance of the second compound semiconductor layer becomes the minimum. The absorption coefficient of the second compound semiconductor layer is defined in terms of decreasing resistance of the laser diode device as much as possible. In the result, in general, the absorption coefficient of light of the third compound semiconductor layer becomes 50 $cm^{-1}$. However, it is possible that the Mg dope amount is intentionally set to the concentration of $2*10^{19}$ $cm^{-3}$ or more in order to increase the absorption coefficient. In this case, the upper limit Mg dope amount for obtaining a practical electron hole concentration is, for example, $8*10^{19}$ $cm^{-3}$. Further, the second compound semiconductor layer may have a non-doped compound semiconductor layer and a p-type compound semiconductor layer from the third compound semiconductor layer side. The distance from the third compound semiconductor layer to the p-type compound semiconductor layer may be $1.2*10^{-7}$ m or less. By defining the distance from the third compound semiconductor layer to the p-type compound semiconductor layer as described above, internal loss is able to be inhibited in a range in which the internal quantum efficiency is not lowered. Thereby, threshold current $I_{th}$ at which laser oscillation is started is able to be decreased. Though the lower limit value of the distance from the third compound semiconductor layer to the p-type compound semiconductor layer is not limited, for example, the lower limit value is $5*10^{-8}$ m. Further, on both side faces of the ridge section, a laminated insulating film composed of $SiO_2/Si$ laminated structure may be formed. The difference between the effective refractive index of the ridge section and the effective refractive index of the laminated insulating film may be from $5*10^{-3}$ to $1*10^{-2}$ both inclusive. By using such a laminated insulating film, even in the case of high output operation exceeding 100 mW, single fundamental lateral mode is able to be maintained. Further, the second compound semiconductor layer may have a structure in which a non-doped GaInN layer (p-side light waveguide layer), a non-doped AlGaN layer (p-side cladding layer), a Mg doped AlGaN layer (electron barrier layer), a superlattice structure (superlattice cladding layer) composed of a GaN layer (Mg doped)/AlGaN layer, and a Mg doped GaN layer (p-side contact layer) are layered from the third compound semiconductor layer side. The bandgap of compound semiconductor composing the well layer in the third compound semiconductor layer is desirably 2.4 eV or more. Further, the wavelength of laser light outputted from the third compound semiconductor layer is desirably from 360 nm to 500 nm both inclusive, and is preferably from 400 nm to 410 nm both inclusive. It is needless to say that the foregoing various structures are able to be combined as appropriate.

As described above, in the second compound semiconductor layer, a non-doped compound semiconductor layer (for example, a non-doped GaInN layer or a non-doped AlGaN layer) may be formed between the third compound semiconductor layer and the electron barrier layer. Further, a non-doped GaInN layer as a light waveguide layer may be formed between the third compound semiconductor layer and the non-doped compound semiconductor layer. The uppermost layer of the second compound semiconductor layer may have a structure occupied by a Mg doped GaN layer (p-side contact layer).

Various GaN compound semiconductor layers composing the semiconductor optical amplifier in the invention or the mode locking laser diode device in the invention are sequentially formed over a substrate. Examples of the substrate include a GaAs substrate, a GaN substrate, a SiC substrate, an alumina substrate, a ZnS substrate, a ZnO substrate, an AlN substrate, a LiMgO substrate, a LiGaO$_2$ substrate, a MgAl$_2$O$_4$ substrate, an InP substrate, an Si substrate, and a laminated body in which a foundation layer and a buffer layer are formed on the surface (main face) of the foregoing substrate in addition to a sapphire substrate. Mainly, in the case where the GaN compound semiconductor layer is formed on the substrate, the GaN substrate has the preference due to its small defect density. However, it is known that in the GaN substrate, its characteristics are changed from/to polarity, non-polarity, and semi-polarity according to the growth plane. Further, examples of methods of forming the various GaN compound semiconductor layers composing the semiconductor optical amplifier in the invention or the mode locking laser diode device in the invention include metal organic chemical vapor deposition method (MOCVD method and MOVPE method), molecular beam epitaxy method (MBE method), and hydride vapor growth method in which halogen contributes to transfer or reaction and the like.

Examples of organic gallium source gas in MOCVD method include trimethyl gallium (TMG) gas and triethyl gallium (TEG) gas. Examples of nitrogen source gas include ammonia gas and hydrazine gas. In forming the GaN compound semiconductor layer having n-type conductivity type, for example, silicon (Si) may be added as n-type impurity (n-type dopant). In forming the GaN compound semiconductor layer having p-type conductivity type, for example, magnesium (Mg) may be added as p-type impurity (p-type dopant). Further, in the case where aluminum (Al) or indium (In) is contained as a component atom of the GaN compound semiconductor layer, trimethyl aluminum (TMA) gas may be used as an Al source, and trimethyl indium (TMI) gas may be used as an In source. Further, monosilane gas ($SiH_4$ gas) may be used as an Si source, and ciclopentadienyl magnesium gas, methylciclopentadienyl magnesium, or bisciclopentadienyl magnesium ($Cp_2Mg$) may be used as an Mg source. Examples of n-type impurity (n-type dopant) include Ge, Se, Sn, C, Te, S, O, Pd, and Po in addition to Si. Examples of p-type impurity (p-type dopant) include Zn, Cd, Be, Ca, Ba, C, Hg, and Sr in addition to Mg.

Where the first conductive type is n type, the first electrode electrically connected to the first compound semiconductor layer having n-type conductivity type desirably has a single layer structure or a multilayer structure containing at least one metal selected from the group consisting of gold (Au), silver (Ag), palladium (Pd), Al (aluminum), Ti (titanium), tungsten (W), Cu (copper), Zn (zinc), tin (Sn) and indium (In), and for example, Ti/Au, Ti/Al, and Ti/Pt/Au are able to be exemplified. The first electrode is electrically connected to the first compound semiconductor layer. The first electrode may be formed on the first compound semiconductor layer, and the first electrode may be connected to the first compound semiconductor layer with a conductive material layer or a conducive substrate in between. The first electrode and the second electrode are able to be formed by PVD method such as vacuum evaporation method and sputtering method.

A pad electrode may be provided on the first electrode and the second electrode in order to obtain electrical connection to an external electrode or a circuit. The pad electrode desirably has a single layer structure or a multilayer structure containing at least one metal selected from the group consisting of Ti (titanium), aluminum (Al), Pt (platinum), Au (gold), and Ni (nickel). Otherwise, the pad electrode may have a multilayer structure exemplified as a Ti/Pt/Au multilayer structure and a Ti/Au multilayer structure.

The mode locking laser diode device in the invention may further include an external reflecting mirror. That is, the mode locking laser diode device in the invention may be an external resonator type mode locking laser diode device. Further, the mode locking laser diode device in the invention may be a monolithic mode locking laser diode device. The external resonator type mode locking laser diode device may be light condensing type, or collimation type. In the external resonator type mode locking laser diode device, light reflectance on one end face of a laminated structure from which light pulse is outputted is preferably 0.5% or less. The light reflectance value is significantly lower than the light reflectance on one end face of a laminated structure from which light pulse is outputted in existing laser diode devices (in general, from 5% to 10% both inclusive). In the external resonator mode locking laser diode device, the value of the external resonator (Z', unit: mm) desirably satisfies $0<Z'<1500$, and preferably satisfies $30 \leq Z' \leq 150$.

The invention is applicable to various fields such as the optical disc system, the communication field, the optical information field, the photoelectronic integration circuit, the field applying nonlinear optical phenomenon, the optical switch, the laser measurement field and various analysis fields, the ultrafast spectroscopy field, the multiphoton excitation spectroscopy field, the mass analysis field, the microspectroscopic field using multiphoton absorption, quantum control of chemical reaction, the nano three-dimensional processing field, various processing fields applying multiphoton absorption, the medical field, and the bio imaging field.

First Example

Figure 2:
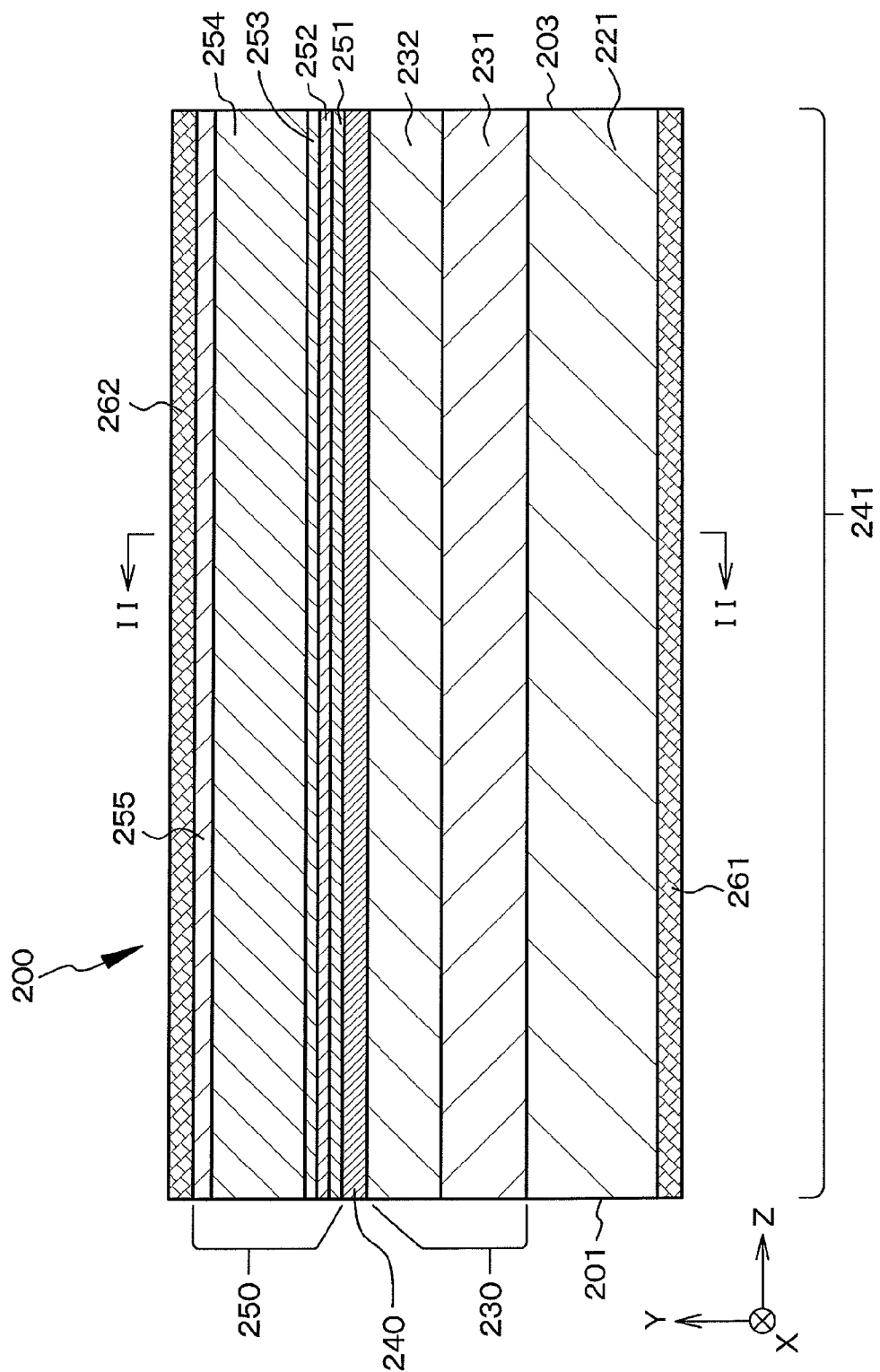
FIG. 2 is a schematic cross sectional view of a semiconductor optical amplifier where the semiconductor optical amplifier is cut along a virtual vertical plane (YZ plane) including an axis line (Z direction) of the semiconductor optical amplifier of the first example.
Figure 3:
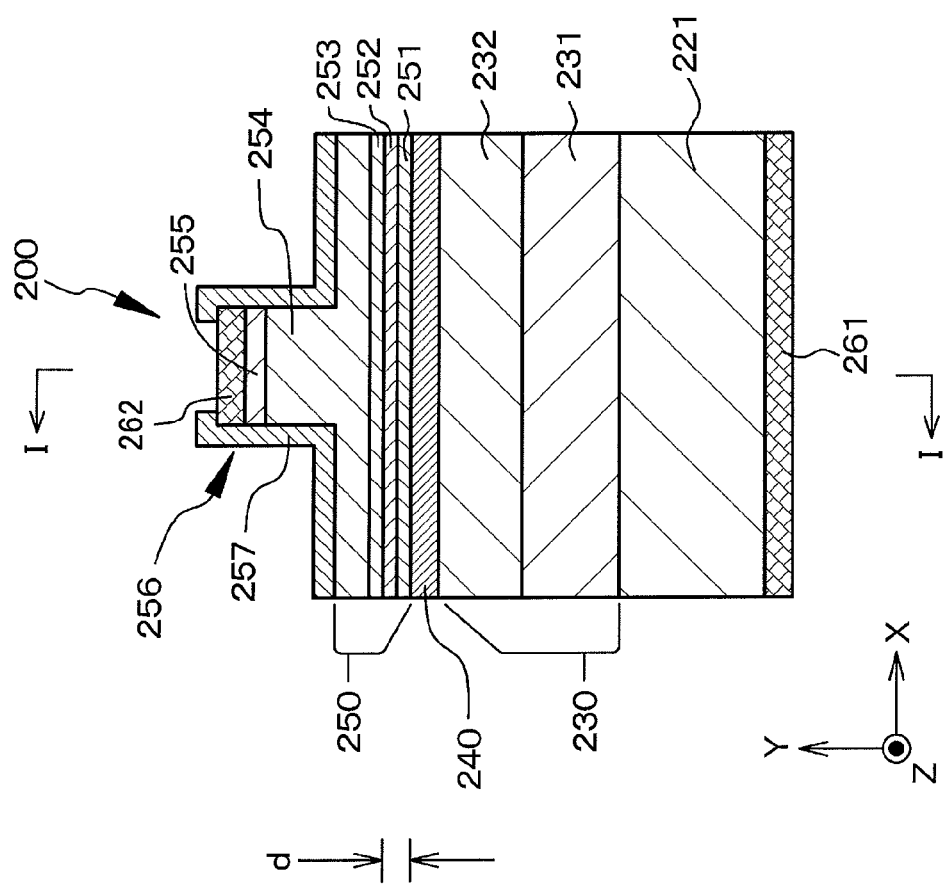
FIG. 3 is a schematic cross sectional view of the semiconductor optical amplifier where the semiconductor optical amplifier is cut along a virtual vertical plane (XY plane) orthogonal to the axis line of the semiconductor optical amplifier of the first example.

The first example relates to the alignment method of a semiconductor optical amplifier according to the first embodiment of the invention and the light output device according to the first embodiment of the invention. FIG. 1 illustrates a conceptual view of a light output device of the first example including a conceptual view of the semiconductor optical amplifier. FIG. 2 illustrates a schematic cross sectional view of the semiconductor optical amplifier where the semiconductor optical amplifier is cut along a virtual vertical plane (YZ plane) including an axis line of the semiconductor optical amplifier (direction in which a light waveguide extends, and is referred to as "Z direction" for convenience sake). FIG. 3 illustrates a schematic cross sectional view of the semiconductor optical amplifier where the semiconductor optical amplifier is cut along a virtual vertical plane (XY plane) orthogonal to the axis line of the semiconductor optical amplifier. FIG. 2 is a schematic cross sectional view taken along line I-I of FIG. 3. FIG. 3 is a schematic cross sectional view taken along line II-II of FIG. 2.

Figure 10:
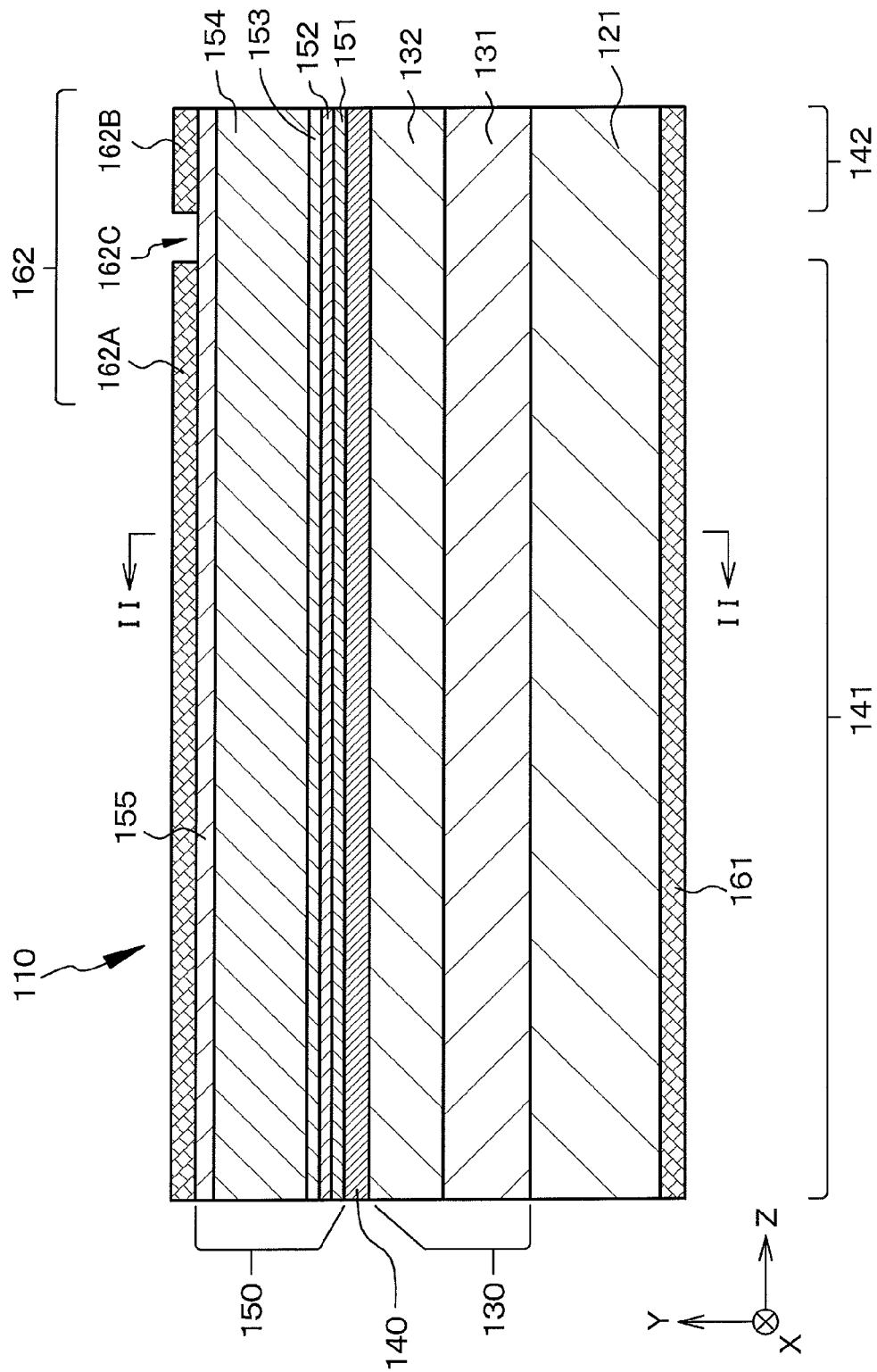
FIG. 10 is a schematic end view taken along a direction in which a resonator of a mode locking laser diode device in the first example is extended.
Figure 11A:
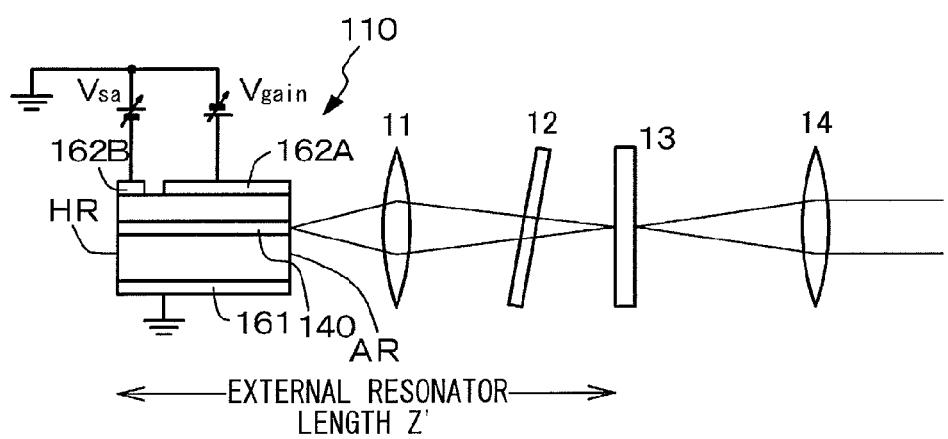
FIGS. 11A and 11B are views that respectively and schematically illustrate a system of performing mode locking drive by configuring an external resonator from the mode locking laser diode device of the first example and a mode locking laser diode device of a sixth example.

Further, FIG. 10 illustrates a schematic end view taken along the direction in which a resonator of a mode locking laser diode device configuring a laser light source extends (a schematic end view where the mode locking laser diode device is cut along the YZ plane). A schematic cross sectional view taken along the direction orthogonal to the direction in which the resonator extends (schematic cross sectional view where the mode locking laser diode device is cut along the XY plane) is the same as FIG. 3 except for referential numbers. That is, the 200s referential numbers in FIG. 3 correspond to 100s referential numbers of the schematic cross sectional view taken along the direction orthogonal to the direction in which the resonator extends. FIG. 10 is a schematic end view similar to the view taken along line I-I of FIG. 3. Further, FIG. 11A schematically illustrates a system of performing mode locking drive by forming an external resonator from the mode locking laser diode device of the first example.

The light output device of the first example includes: a laser light source 100; a semiconductor optical amplifier 200 that optically amplifies laser light from the laser light source 100 and outputs the amplified light; an alignment device 300 that adjusts relative position of the semiconductor optical amplifier with respect to laser light entering the semiconductor optical amplifier 200; and a semiconductor optical amplifier control device 400 that controls operation of the semiconductor optical amplifier 200.

As illustrated in FIG. 1, the semiconductor optical amplifier 200 is composed of a transmissive semiconductor optical amplifier. Low reflective coating layers (AR) 202 and 204 are formed on a light entrance end face 201 of the semiconductor optical amplifier 200 and a light output end face 203 opposed to the light entrance end face 201. The low reflective coating layers are formed from a laminated structure composed of at least two types of layers selected from the group consisting of a titanium oxide layer, a tantalum oxide layer, a zirconia layer, a silicon oxide layer, and an aluminum oxide layer. The laser light entering from the light entrance end face 201 side is optically amplified inside the semiconductor optical amplifier 200, and is outputted from the light output end face 203 on the opposite side of the light entrance end face 201 side. The laser light is fundamentally guided in only one direction. Further, in the first example, the laser light source 100 is composed of a mode locking laser diode device. Pulse laser light outputted from the mode locking laser device enters the semiconductor optical amplifier 200. The laser light source 100 outputs the pulse laser light based on mode locking operation. For the details of the mode locking laser diode device, the description will be given later. The semiconductor optical amplifier 200 in the first example substantially has the same composition and the same configuration as the composition and the structure of a mode locking laser diode device 110 configuring the laser light source 100 in the first example, except for the composition and the structure of the second electrode.

In the light output device of the first example illustrated in FIG. 1, the laser light source 100 is composed of the mode locking laser diode device 110, a lens 11, an optical filter 12, an external mirror 13, and a lens 14. Laser light outputted from the laser light source 100 enters a reflecting mirror 20 through an optical isolator 15 and a reflecting mirror 16. Laser light reflected by the reflecting mirror 20 passes through a half-wave plate (λ/2 wave plate) 21 and a lens 22, and enters the semiconductor optical amplifier 200. The half-wave plate (λ/2 wave plate) 21 is arranged to prevent returned light from the semiconductor optical amplifier 200 from heading for the laser light source 100. The laser light is optically amplified in the semiconductor optical amplifier 200, and is outputted outside the system through a lens 30. The reflecting mirror 20, the half-wave plate 21, and the lens 22 are placed on the alignment device 300. The alignment device 300 is specifically composed of an XYZ stage. Where the thickness direction of the laminated structure in the semiconductor optical amplifier 200 described later is Y direction and the axis line direction of the semiconductor optical amplifier 200 is Z direction, the reflecting mirror 20 and the lens 21 are moved in the X direction, the Y direction, and the Z direction by the alignment device 300.

The semiconductor optical amplifier 200 includes: a laminated structure in which a first compound semiconductor layer 230 that has a first conductivity type (in the first example, specifically, n-type conductivity type) and is composed of GaN compound semiconductor, a third compound semiconductor layer (active layer) 240 that has a light amplification region (carrier injection region and gain region) 241 composed of GaN compound semiconductor, and a second compound semiconductor layer 250 that has a second conductivity type different from the first conductivity type (in the first example, specifically, p-type conductivity type) and is composed of GaN compound semiconductor are sequentially layered; a second electrode 262 formed on the second compound semiconductor layer 250; and a first electrode 261 electrically connected to the first compound semiconductor layer 230.

Meanwhile, the mode locking laser diode device 110 that structures the laser light source 100 and has light emitting wavelength band of 405 nm includes: a laminated structure in which a first compound semiconductor layer 130 that has a first conductivity type (in the first example, specifically, n-type conductivity type) and is composed of GaN compound semiconductor, a third compound semiconductor layer (active layer) 140 that has a light emitting region (gain region) 141 composed of GaN compound semiconductor, and a second compound semiconductor layer 150 that has a second conductivity type different from the first conductivity type (in the first example, specifically, p-type conductivity type) and is composed of GaN compound semiconductor are sequentially layered; a strip-shaped second electrode 162 formed on the second compound semiconductor layer 150; and a first electrode 161 electrically connected to the first compound semiconductor layer 130.

The laminated structure is formed on compound semiconductor substrates 121 and 221 having polarity. The third compound semiconductor layers 140 and 240 have a quantum well structure including a well layer and a barrier layer. The thickness of the well layer is from 1 nm to 10 nm both inclusive. The doping concentration of impurity (specifically, silicon (Si)) of the barrier layer is from $2*10^{18}$ cm$^{-3}$ to $1*10^{20}$ cm$^{-3}$ both inclusive.

Specifically, the mode locking laser diode device 110 and the semiconductor optical amplifier 200 of the first example have a ridge stripe type separate confinement heterostructure (SCH structure). More specifically, the mode locking laser diode device 110 and the semiconductor optical amplifier 200 of the first example have a GaN laser diode structure composed of an index guide type AlGaInN, and a straight line-like ridge structure (ridge stripe structure). In addition, the mode locking laser diode device 110 and the semiconductor optical amplifier 200 are provided on (0001) plane of the n-type GaN substrates 121 and 221. The third compound semiconductor layers 140 and 240 have a quantum well structure. The (0001) plane of the n-type GaN substrates 121 and 221 is also called "C plane," and is a crystal plane having polarity. The first compound semiconductor layers 130 and 230, the third compound semiconductor layers 140 and 240, and the second compound semiconductor layers 150 and 250 are specifically composed of AlGaInN compound semiconductor. More specifically, the first compound semiconductor layers 130 and 230, the third compound semiconductor layers 140 and 240, and the second compound semiconductor layers 150 and 250 have a layer structure illustrated in the following Table 1. In Table 1, the listed items are shown in the order from the layer farthest from the n-type GaN substrates 121 and 221 to the layer closest to the n-type GaN substrates 121 and 221. Band gap of the compound semiconductor composing the well layer in the third compound semiconductor layers 140 and 240 is 3.06 eV.

TABLE 1

Second compound semiconductor layers 150 and 250
p-type GaN contact layer (Mg doped) 155 and 255
p-type GaN (Mg doped)/AlGaN superlattice cladding layers 154 and 254
p-type AlGaN electron barrier layers (Mg doped) 153 and 253
Non-doped AlGaN cladding layers 152 and 252
Non-doped GaInN light waveguide layers 151 and 251
Third compound semiconductor layers 140 and 240
GaInN quantum well active layer
(well layer: $Ga_{0.92}In_{0.08}N$/barrier layer: $Ga_{0.98}In_{0.02}N$)
First compound semiconductor layers 130 and 230
n-type GaN cladding layers 132 and 232
n-type AlGaN cladding layers 131 and 231
where
well layer (two layers): 8 nm [non-doped]
barrier layer (three layers): 10 nm [doping concentration (Si): $2*10^{18}$ cm$^{-3}$]

Further, part of the p-type GaN contact layers 155 and 255 and part of the p-type GaN/AlGaN superlattice cladding layers 154 and 254 are removed by RIE method, and ridge structures (ridge sections 156 and 256) are formed. On both sides of the ridge sections 156 and 256, laminated insulating films 157 and 257 composed of $SiO_2$/Si is formed. The $SiO_2$ layer is the lower layer and the Si layer is the upper layer. The difference between the effective refractive index of the ridge sections 156 and 256 and the effective refractive index of the laminated insulating films 157 and 257 is from $5*10^{-3}$ to $1*10^{-2}$ both inclusive, and is specifically $7*10^{-3}$. On the p-type GaN contact layers 155 and 255 corresponding to the top face of the ridge sections 156 and 256, the second electrodes (p-side ohmic electrodes) 162 and 262 are formed. Meanwhile, on the rear face of the n-type GaN substrates 121 and 221, the first electrodes (n-side ohmic electrode) 161 and 261 composed of Ti/Pt/Au are formed. Specifically, the laminated insulating films 157 and 257 have $SiO_2$/Si laminated structure, and the width of the ridge structure is 1.5 μm.

In the mode locking laser diode device 110 of the first example, the p-type AlGaN electron barrier layer 153, the p-type GaN/AlGaN superlattice cladding layer 154, and the p-type GaN contact layer 155 that are Mg-doped compound semiconductor layers are arranged not to overlap with each other as much as possible in the light density distribution generated from the third compound semiconductor layer 140 and regions in the vicinity thereof. Thereby, internal loss is inhibited in a range in which internal quantum efficiency is not lowered. Thereby, threshold current $I_{th}$ at which laser oscillation is started is decreased. Further, it was found that internal loss $\alpha_i$ was lowered by increasing a value of the distance d from the third compound semiconductor layers 140 to the p-type AlGaN electron barrier layer 153. It was also found that if the value d became a certain value or more, efficiency of hole injection into the well layer was lowered, and as a result, electron-hole recombination ratio in the third compound semiconductor layer 140 was lowered, and internal quantum efficiency $\eta_i$ was decreased. Thus, the distance d from the third compound semiconductor layer 140 to the p-type AlGaN electron barrier layer 153 was set to 0.10 μm, the height of the ridge section (ridge structure) was set to 0.30 μm, the thickness of the second compound semiconductor layer 150 located between the second electrode 162 and the third compound semiconductor layer 140 was set to 0.50 μm, and the thickness of a section of the p-type GaN/AlGaN superlattice cladding layer 154 located below the second electrode 162 was set to 0.40 μm. "The distance d between the electron barrier layer 153 and the third compound semiconductor layers 140" means a distance between a region of the electron barrier layer 153 facing the third compound semiconductor layer 140 (interface) and a region of the third compound semiconductor layer 140 facing the electron barrier layer 153 (interface). A composition and a configuration of the semiconductor optical amplifier 200 are similar to the foregoing composition and the foregoing structure of the mode locking laser diode device 110.

In the first example, the second electrodes 162 and 262 are formed from a Pd single layer having a thickness of 0.1 μm. Further, in the first example, the width of an isolation trench 162C that separates the second electrode 162 composing the mode locking laser diode device into a first section 162A and a second section 162B is 1 μm or more and 50% or less the length of the resonator length. Further, the length of a saturable absorption region 142 is shorter than the length of the light emitting region 141. Further, the length of the second electrode 162 (total length of the first section and the second section) is shorter than the length of the third compound semiconductor layer 140. Specifically, resonator length Z" was set to 0.60 mm, the length of the first section 162A of the second electrode 162 was set to 0.52 mm, the length of the second section 162B was set to 0.06 mm, and the width of the isolation trench 162C (length in the resonator length direction) was set to 0.02 mm. In the semiconductor optical amplifier 200, the second electrode 262 is not provided with an isolation trench.

The thickness of the p-type GaN/AlGaN superlattice cladding layers 154 and 254 having a superlattice structure in which a p-type GaN layer and a p-type AlGaN layer are alternately layered is 0.7 μm or less, and specifically 0.4 μm. The thickness of the p-type GaN layer composing the superlattice structure is 2.5 nm. The thickness of the p-type AlGaN layer composing the superlattice structure is 2.5 nm. The total number of layers of the p-type GaN layer and the p-type AlGaN layer is 160. Further, the distance from the third compound semiconductor layers 140 and 240 to the second electrodes 162 and 262 is 1 μm or less, and specifically 0.5 μm. Further, the p-type AlGaN electron barrier layers 153 and 253, the p-type GaN/AlGaN superlattice cladding layers 154 and 254, and the p-type GaN contact layers 155 and 255 composing the second compound semiconductor layers 150 and 250 are doped with Mg at the level of $1*10^{19}$ $cm^{-3}$ or more (specifically at the level of $2*10^{19}$ $cm^{-3}$). The absorption coefficient of the second compound semiconductor layers 150 and 250 to light in 405 nm wavelength is at least 50 $cm^{-1}$, and specifically 65 $cm^{-1}$. Further, the second compound semiconductor layers 150 and 250 are provided with the non-doped compound semiconductor layer (the non-doped GaInN light waveguide layers 151 and 251 and the non-doped AlGaN cladding layers 152 and 252) and the p-type compound semiconductor layer from the third compound semiconductor layer side. The distance d from the third compound semiconductor layer 140 to the p-type compound semiconductor layer (specifically, the p-type AlGaN electron barrier layers 153 and 253) is $1.2*10^{-7}$ m or less, and specifically 100 nm.

In the alignment method of a semiconductor optical amplifier or the light output device of the first example, a given value of current (DC current and forward bias current) $I_0$ is flown to the semiconductor optical amplifier 200 while laser light enters the semiconductor optical amplifier 200 from the laser light source 100. The relative position of the semiconductor optical amplifier 200 with respect to the laser light entering the semiconductor optical amplifier 200 is adjusted so that a voltage applied to (added to) the semiconductor optical amplifier 200 becomes the maximum.

The semiconductor optical amplifier control device 400 is specifically composed of a combination of a known DC electric power source, a voltage measurement device, and a current measurement device. Further, resolution capability of a voltage monitor in the semiconductor optical amplifier control device 400 is 1 millivolt or less, and is more specifically 0.1 millivolt or less. Further, resolution capability of a current monitor in the semiconductor optical amplifier control device 400 is 100 microampere or less, and is more specifically 10 microampere or less.

Figure 4A:
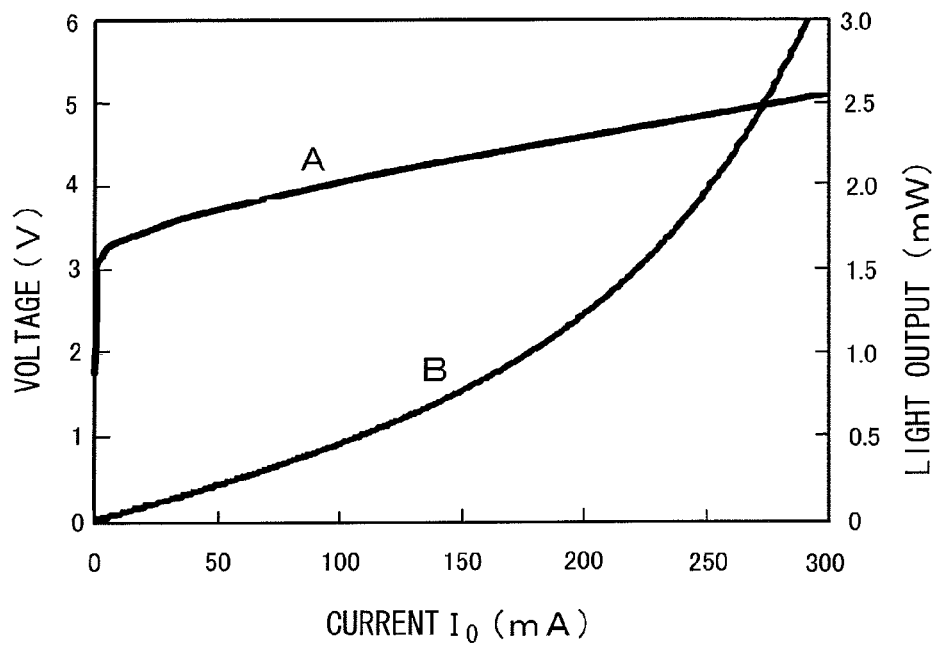
FIG. 4A is a graph illustrating light output and a voltage applied between a second electrode and a first electrode in the case where a current is flown from the second electrode to the first electrode in the semiconductor optical amplifier of the first example.
Figure 4B:
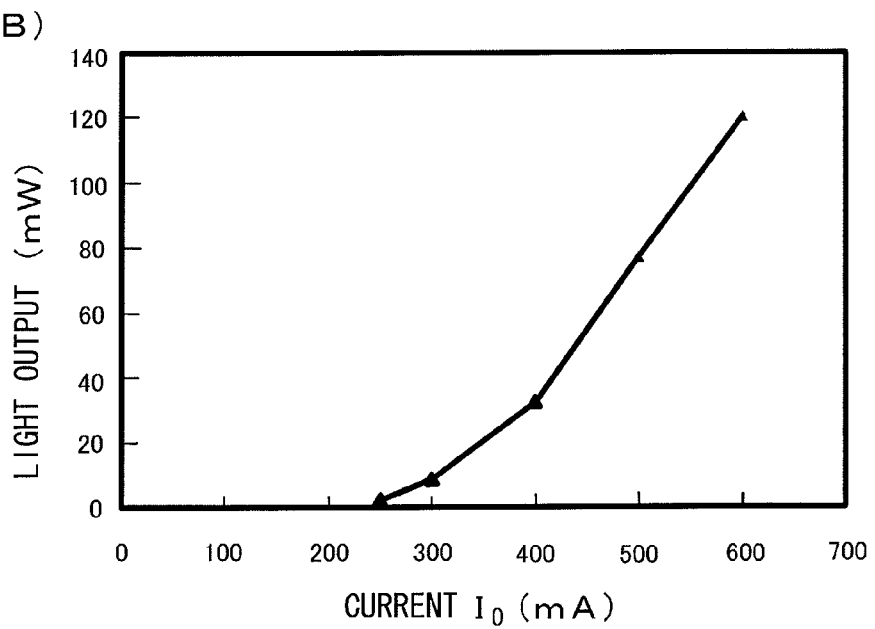
FIG. 4B is a graph illustrating light output in the case where a current is flown from the second electrode to the first electrode in the semiconductor optical amplifier of the first example.

FIGS. 4A and 4B illustrate basic characteristics of the semiconductor optical amplifier 200. FIGS. 4A and 4B illustrate light output where the current $I_0$ is flown from the second electrode 262 to the first electrode 261 (indicated by curved line "B" in FIG. 4A). FIG. 4A further illustrates the voltage $V_0$ applied between the second electrode 262 and the first electrode 261 in the case where the current $I_0$ is flown from the second electrode 262 to the first electrode 261 (indicated by curved line "A" in FIG. 4A). The horizontal axis indicates a value of the current $I_0$ (unit: milliampere) flown from the second electrode 262 to the first electrode 261, and the vertical axis indicates voltage V (unit: volt) applied between the second electrode 262 and the first electrode 261 and light output (unit: milliwatt). FIG. 4A illustrates a graph in a state that laser light does not enter the semiconductor optical amplifier 200 from the laser light source 100. FIG. 4B illustrates a graph in a state that laser light enters the semiconductor optical amplifier 200 from the laser light source 100 (light output: 2 milliwatt). From FIGS. 4A and 4B, it is found that in a state that 300 milliampere current $I_0$ is flown from the second electrode 262 to the first electrode 261, in the case where laser light does not enter the semiconductor optical amplifier 200 from the laser light source 100, light output from the semiconductor optical amplifier 200 is 2.6 milliwatt, while in the case where laser light enters the semiconductor optical amplifier 200 from the laser light source 100, light output from the semiconductor optical amplifier 200 is 8.5 milliwatt, which shows that incident laser light to the semiconductor optical amplifier 200 is amplified about 3 times by the semiconductor optical amplifier 200. In the semiconductor optical amplifier 200, laser oscillation is not made. Further, from FIG. 4B, it is found that in the case where the current $I_0$ flown from the second electrode 262 to the first electrode 261 is increased, incident laser light to the semiconductor optical amplifier 200 is significantly amplified by the semiconductor optical amplifier 200.

Figure 5:
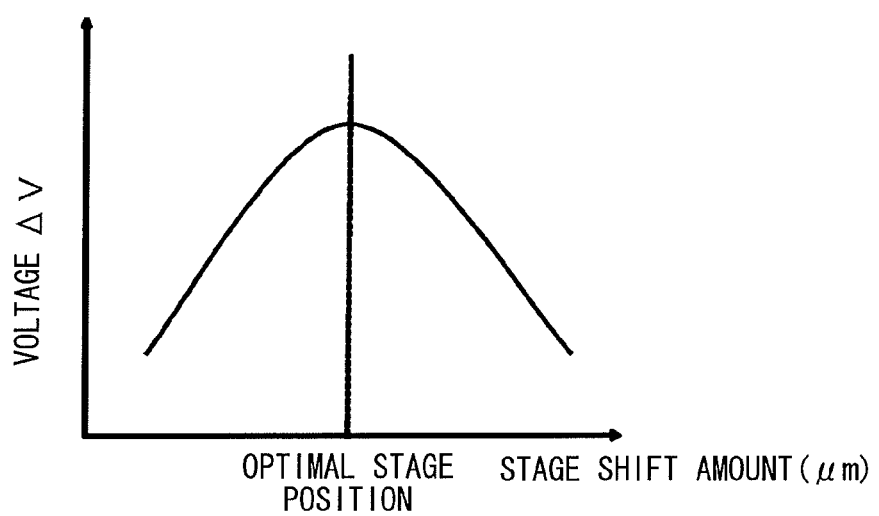
FIG. 5 is a graph schematically illustrating change of a voltage applied to the semiconductor optical amplifier in the case where a given value of current is flown to the semiconductor optical amplifier while laser light enters the semiconductor optical amplifier of the first example from a laser light source and XYZ stage is moved in the X direction.

FIG. 5 schematically illustrates change of voltage $\Delta V$ applied to (added to) the semiconductor optical amplifier 200 in the case where a given value of current $I_0$ is flown to the semiconductor optical amplifier 200 while laser light enters the semiconductor optical amplifier 200 from the laser light source 100 and the XYZ stage is moved in the X direction. Along with movement of the XYZ stage in the X direction, the voltage $\Delta V$ applied to the semiconductor optical amplifier 200 is flatly increased until $\Delta V$ exceeds the maximum value, and is flatly decreased. When a voltage applied to (added to) the semiconductor optical amplifier 200 in the case where a given value of current $I_0$ is flown to the semiconductor optical amplifier 200 while laser light does not enter the semiconductor optical amplifier 200 from the laser light source 100 is $V_1$, and a voltage applied to (added to) the semiconductor optical amplifier 200 in the case where a given value of current $I_0$ is flown to the semiconductor optical amplifier 200 while laser light enters the semiconductor optical amplifier 200 from the laser light source 100 is $V_2$, $\Delta V$ is expressed as $\Delta V=(V_2-V_1)$. A value of $\Delta V$ is 1 millivolt or less, and is often 0.1 millivolt or less. Further, a value of $\Delta V/V_1$ is 1% or less. Change of light output of laser light emitted from the semiconductor optical amplifier 200 at this time shows the totally same behavior as that of change of the voltage $\Delta V$. Thus, the relative position of the semiconductor optical amplifier 200 with respect to the laser light entering the semiconductor optical amplifier 200 is adjusted so that the voltage $\Delta V$ applied to (added to) the semiconductor optical amplifier 200 becomes the maximum. Thereby, light output of laser light outputted from the semiconductor optical amplifier 200 is able to be the maximum.

Further, in the semiconductor optical amplifier 200 of the first example, a given value of current $I_0$ is flown to the semiconductor optical amplifier 200 while laser light enters the semiconductor optical amplifier 200 from the laser light source 100, a voltage applied to the semiconductor optical amplifier 200 is monitored by the semiconductor optical amplifier control device 400. The relative position of the semiconductor optical amplifier 200 with respect to the laser light entering the semiconductor optical amplifier 200 is adjusted so that the voltage applied to the semiconductor optical amplifier 200 becomes the maximum by the alignment device 300. Specifically, the relative position of the semiconductor optical amplifier 200 with respect to laser light entering the semiconductor optical amplifier 200 is adjusted by the alignment device 300 so that a value of $\Delta V=(V_2-V_1)$ becomes the maximum.

Figures 6A, 6B:
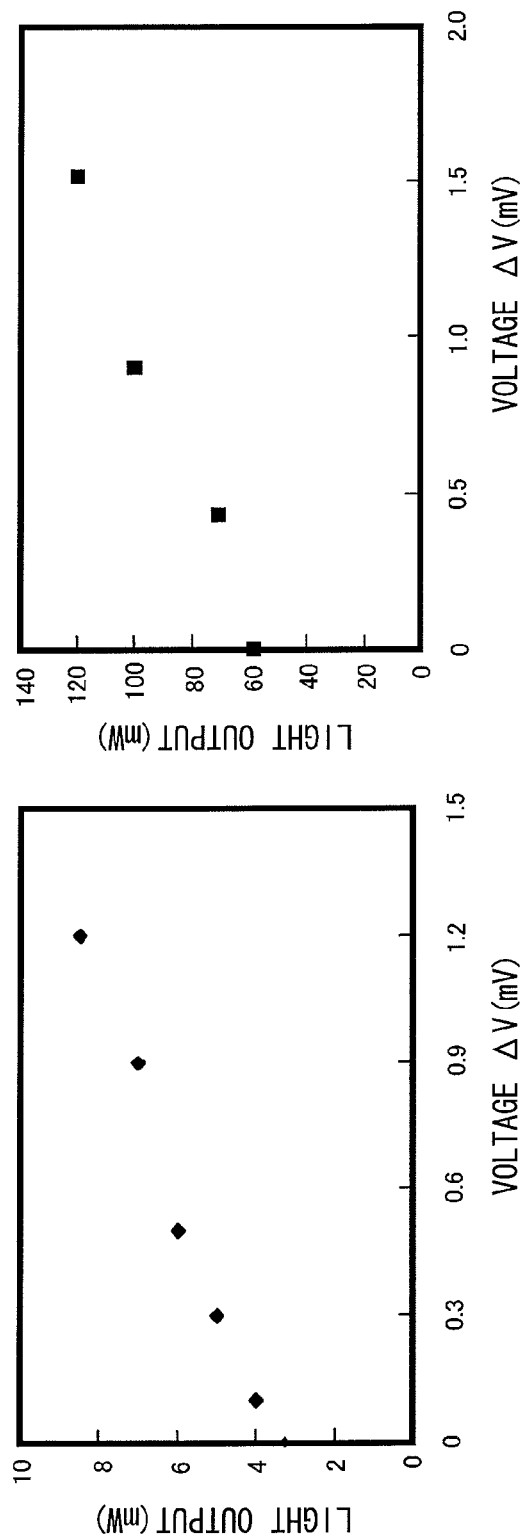
FIGS. 6A and 6B are respectively graphs illustrating a relation between light output and voltage Δ in the case where a current is flown from the second electrode to the first electrode in a state that laser light (light output: 2 milliwatt) enters the semiconductor optical amplifier of the first example from the laser light source.

Further, FIGS. 6A and 6B illustrate relation between light output and the voltage $\Delta V$ in the case where the current $I_0$ is flown from the second electrode 262 to the first electrode 261 in a state that laser light enters the semiconductor optical amplifier 200 from the laser light source 100 (light output: 2 milliwatt). In the example illustrated in FIG. 6A, as a value per unit area of the second electrode, a value of the current $I_0$ is 3 kiloampere/cm$^2$. In the example illustrated in FIG. 6B, as a value per unit area of the second electrode, a value of the current $I_0$ is 6 kiloampere/cm$^2$. As the value of the current $I_0$ is increased, optical amplification ratio is improved and the value of the voltage $\Delta V$ is increased.

In the semiconductor optical amplifier 200 of the first example, in the case where a given value of current $I_0$ is flown to the semiconductor optical amplifier 200 while laser light enters the semiconductor optical amplifier 200 from the laser light source 100 and the XYZ stage is moved in the X direction, as illustrated in FIG. 5, a voltage applied to (added to) the semiconductor optical amplifier 200 is increased. In the case where the XYZ stage is moved, light output from the semiconductor optical amplifier 200 is increased. In the case where such a phenomenon is generated, the number of carriers in the light amplification region (carrier injection region and gain region) 241 is decreased. Thus, a voltage applied to (added to) the semiconductor optical amplifier 200 is increased to compensate such decrease of the number of carriers. The alignment method of a semiconductor optical amplifier and the light output device in the first example are based on the foregoing phenomenon. An alignment device (XYZ stage) 300 may be moved by an operator. Otherwise, the alignment device (XYZ stage) 300 is able to be automatically moved by direction of the semiconductor optical amplifier control device 400 based on voltage measurement result.

In the alignment method of a semiconductor optical amplifier of the first example and the light output device of the first example, a voltage applied to the semiconductor optical amplifier 200 is measured to adjust the relative position of the semiconductor optical amplifier 200 with respect to laser light entering the semiconductor optical amplifier 200. Thus, measurement for position adjustment is able to be performed without depending on an external monitoring device. Thus, the relative position of the semiconductor optical amplifier 200 with respect to laser light entering the semiconductor optical amplifier 200 is able to be adjusted accurately.

In the mode locking laser diode device 110 of the first example, the third compound semiconductor layer 140 includes the saturable absorption region 142. Further, the second electrode 162 is separated into the first section 162A for obtaining forward bias state by flowing a current to the first electrode 161 through the light emitting region 141 and the second section 162B for applying an electric field to the saturable absorption region 142 by the isolation trench 162C. Forward bias state is obtained by flowing a current from the first section 162A of the second electrode 162 to the first electrode 161 through the light emitting region 141, and an electric field is added to the saturable absorption region 142 by applying a voltage between the first electrode 161 and the second section 162B of the second electrode 162. In addition, in the mode locking laser diode device of the first example, light pulse is generated in the light emitting region 141 by flowing a current from the second electrode 162 to the first electrode 161 through the laminated structure.

Specifically, in the mode locking laser diode device 110 of the first example, as described above, the second electrode 162 is separated into the first section 162A for obtaining forward bias state by flowing a DC current (forward bias current $I_{gain}$) to the first electrode 161 through the light emitting region (gain region) 141 and the second section 162B for applying an electric field to the saturable absorption region 142 (the second section 162B for adding reverse bias voltage $V_{sa}$ to the saturable absorption region 142) by the isolation trench 162C. The electric resistance value (also referred to as "separating resistance value") between the first section 162A and the second section 162B of the second electrode 162 is 1*10 times or more the electric resistance value between the second electrode 162 and the first electrode 161, and is specifically 1.5*10³ times the electric resistance value between the second electrode 162 and the first electrode 161. Further, the electric resistance value (separating resistance value) between the first section 162A and the second section 162B of the second electrode 162 is 1*10²Ω or more, and is specifically 1.5*10⁴Ω or more.

Further, in the mode locking laser diode device 110 of the first example, the second electrode 162 having a separating resistance value of 1*10²Ω or more should be formed on the second compound semiconductor layer 150. In the case of the GaN laser diode device, mobility in the compound semiconductor having p-type conductivity type is small differently from in the existing GaAs laser diode device. Thus, it is possible that the electric resistance value between the first section 162A and the second section 162B of the second electrode 162 becomes 10 times or more the electric resistance value between the second electrode 162 and the first electrode 161, or the electric resistance value between the first section 162A and the second section 162B of the second electrode 162 becomes 1*10²Ω or more without setting high resistance of the second compound semiconductor layer 150 having p-type conductivity type by ion injection or the like but by separating the second electrode 162 formed thereon by the isolation trench 162C.

Figure 23A:
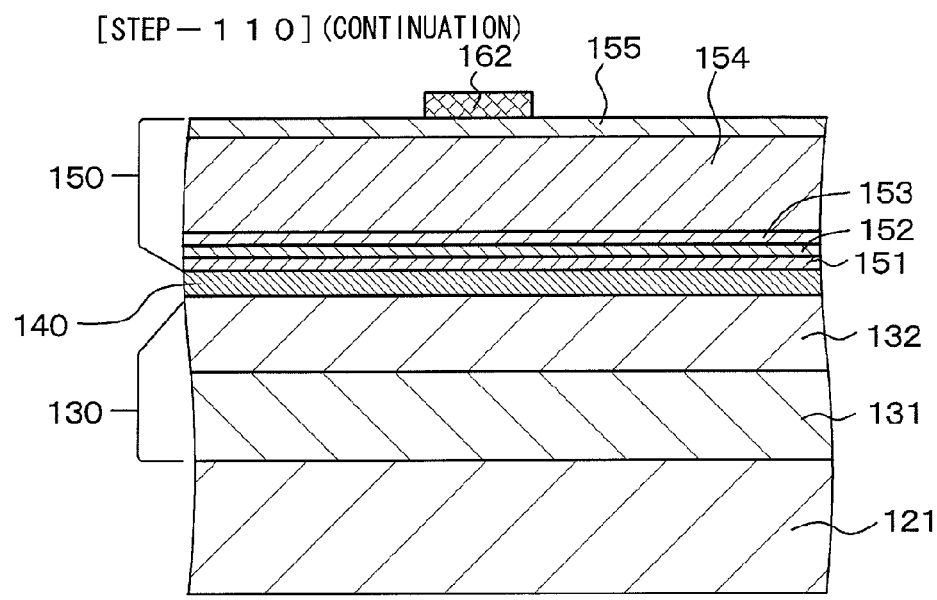
FIGS. 23A and 23B are schematic partial cross sectional views of the substrate and the like for explaining the method of manufacturing the mode locking laser diode device in the first example following FIG. 22B.
Figure 23B:
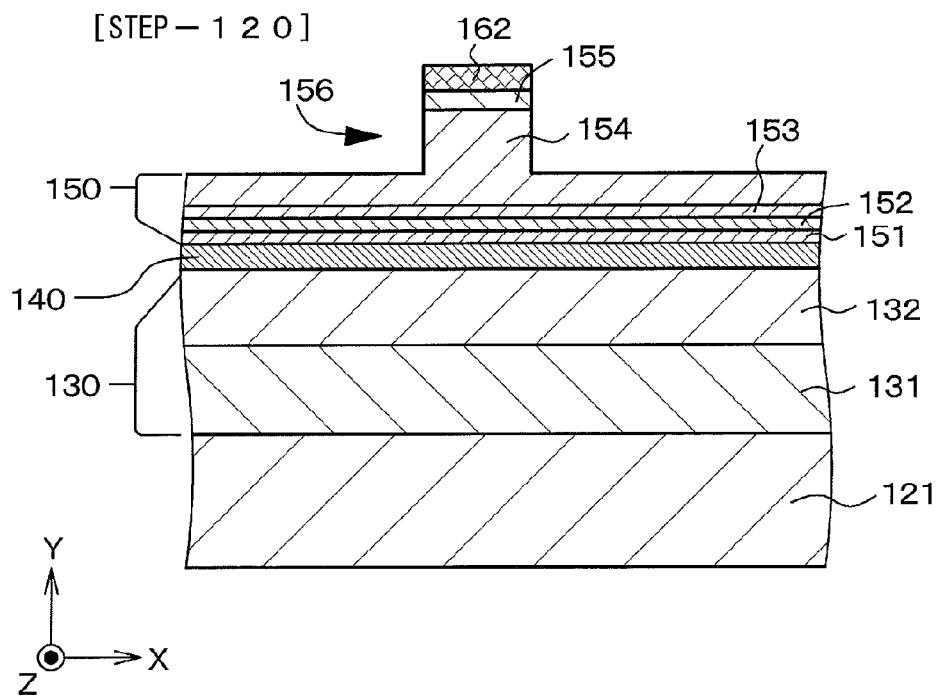
Figure 24:
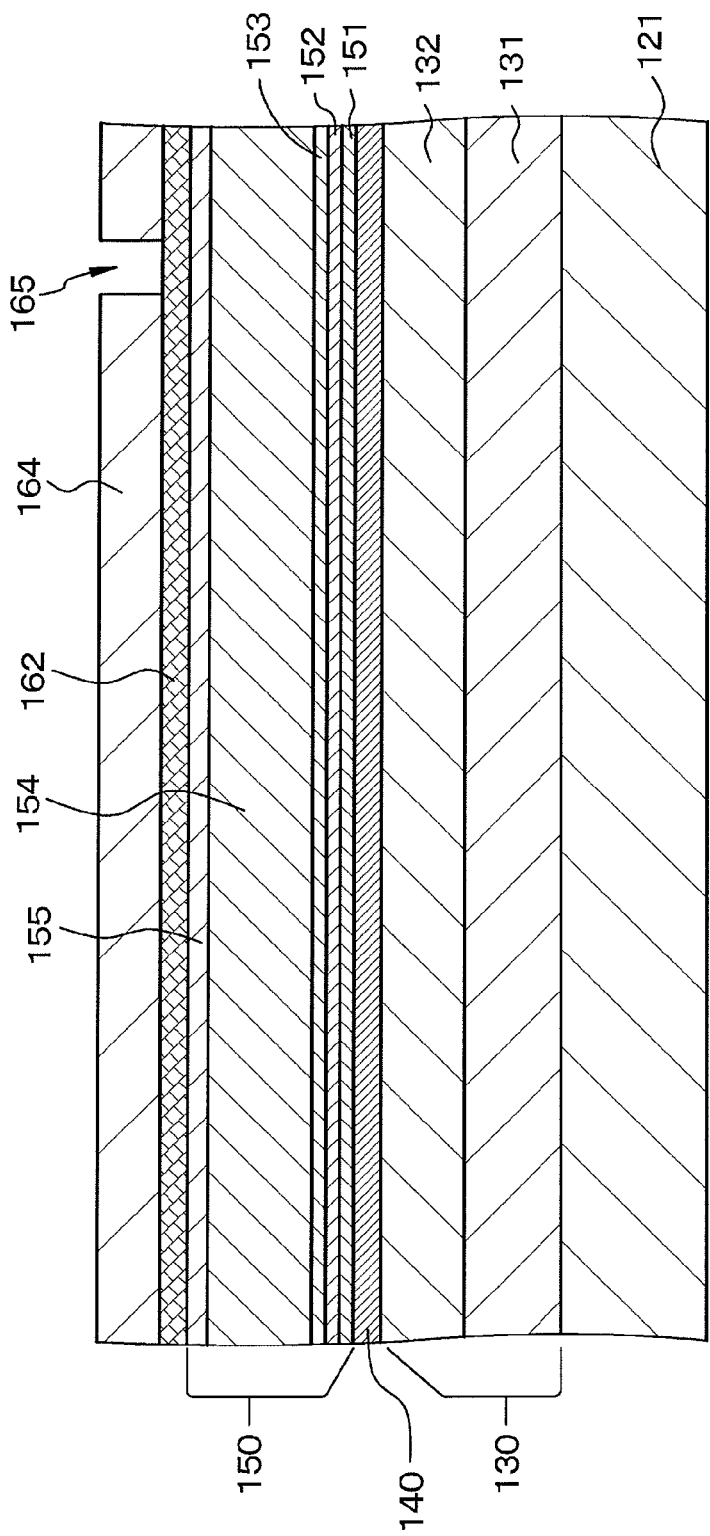
FIG. 24 is a schematic partial end view of the substrate and the like for explaining the method of manufacturing the mode locking laser diode device in the first example following FIG. 23B.

A description will be given of a method of manufacturing the mode locking laser diode device of the first example with reference to FIGS. 22A, 22B, 23A, 23B, and 24. FIGS. 22A, 22B, 23A, and 23B are schematic partial cross sectional views where the substrate and the like are cut in XY plane. FIG. 24 is a schematic partial end view where the substrate and the like are cut in YZ plane.

Requested characteristics of the second electrode 162 are as follows:
(1) a function as an etching mask in etching the second compound semiconductor layer 150 is included;
(2) the second electrode 162 is able to be wet-etched without deteriorating optical and electric characteristics of the second compound semiconductor layer 150;
(3) contact specific resistance value of $10^{-2}$ Ω·cm² or less is shown in the case where the second electrode 162 is formed on the second compound semiconductor layer 150;
(4) in the case of a laminated structure, a material composing the lower layer metal layer has large work function, shows low contact specific resistance value to the second compound semiconductor layer 150, and is able to be wet-etched; and
(5) in the case of a laminated structure, a material composing the upper layer metal layer has resistance to etching in forming the ridge structure (for example, $Cl_2$ gas used in RIE method), and is able to be wet-etched.

Step-100

First, a laminated structure in which the first compound semiconductor layer 130 that has first conductivity type (n-type conductivity type) and is composed of GaN compound semiconductor, the third compound semiconductor layer (active layer) 140 including the light emitting region (gain region) 141 composed of GaN compound semiconductor and the saturable absorption region 142, and the second compound semiconductor layer 150 that has second conductivity type (p-type conductivity type) different from the first conductivity type and is composed of GaN compound semiconductor are sequentially layered is formed on a substrate, specifically on (0001) plane of the n-type GaN substrate 121 based on known MOCVD method (refer to FIG. 22A).

Step-110

After that, the strip-shaped second electrode 162 is formed on the second compound semiconductor layer 150. Specifically, after a Pd layer 163 is formed over the entire face of the second compound semiconductor layer 150 based on vacuum evaporation method (refer to FIG. 22B), a strip-shaped etching-use resist layer is formed on the Pd layer 163 based on photolithography technology. After the Pd layer 163 not covered with the etching-use resist layer is removed by using aqua regia, the etching-use resist layer is removed. Thereby, the structure illustrated in FIG. 23A is able to be obtained. It is possible that the strip-shaped second electrode 162 is formed on the second compound semiconductor layer 150 based on liftoff method.

Step-120

Next, at least part of the second compound semiconductor layer 150 is etched (in the first example, part of the second compound semiconductor layer 150 is etched) with the use of the second electrode 162 as an etching-use mask to form the ridge structure. Specifically, part of the second compound semiconductor layer 150 is etched with the use of the second electrode 162 as an etching-use mask based on RIE method using $Cl_2$ gas. Thereby, the structure illustrated in FIG. 23B is able to be obtained. As described above, the ridge structure is formed by self alignment method by using the second electrode 162 patterned in the shape of a strip as an etching-use mask. Thus, misalignment is not generated between the second electrode 162 and the ridge structure.

Step-130

After that, a resist layer 164 for forming the isolation trench in the second electrode 162 is formed (refer to FIG. 24). Referential number 165 represents an aperture provided in the resist layer 164 for forming the isolation trench. Next, the isolation trench 162C is formed in the second electrode 162 by wet etching method with the use of the resist layer 164 as a wet etching-use mask, and thereby the second electrode 162 is separated into the first section 162A and the second section 162B by the isolation trench 162C. Specifically, aqua regia is used as an etching liquid, and the entire body is dipped into the aqua regia for about 10 seconds, and thereby the isolation trench 162C is formed in the second electrode 162. After that, the resist layer 164 is removed. Accordingly, the structure illustrated in FIG. 10 is able to be obtained. As described above, differently from dry etching method, by adopting wet etching method, optical characteristics and electric characteristics of the second compound semiconductor layer 150 are not deteriorated. Thus, light emitting characteristics of the mode locking laser diode device are not deteriorated. If dry etching method is adopted, there is a possibility that internal loss $\alpha_i$ of the second compound semiconductor layer 150 is increased, the threshold voltage is increased, and light output is lowered. In this case, where an etching rate of the second electrode 162 is $ER_0$, and an etching rate of the laminated body is $ER_1$, the following formula is established:

$$ER_0/ER_1 \approx 1*10^2$$

As described above, since the high etching selection ratio exists between the second electrode 162 and the second compound semiconductor layer 150, the second electrode 162 is able to be surely etched without etching the laminated structure (or even if the laminated structure is etched, the etching amount is slight).

Step-140

After that, the n-side electrode 161 is formed, the substrate is cleaved, and further packaging is made. Accordingly, the mode locking laser diode device 110 is able to be fabricated.

In general, resistance R (Ω) of a semiconductor layer is expressed as follows by using specific resistance value ρ (Ω·m) of a material composing the semiconductor layer, length of the semiconductor layer $X_0$ (m), cross section area S of the semiconductor layer (m²), carrier density n (cm⁻³), electric charge amount e (C), and mobility μ (m²/V sec).

$$R=(\rho \cdot X_0)/S = X_0/(n \cdot e \cdot \mu \cdot S)$$

Since mobility of the p-type GaN semiconductor is two-digit or more smaller than that of the p-type GaAs semiconductor, the electric resistance value is easily increased. Thus, it is found that the electric resistance value of the laser diode device having a ridge structure with small cross section area being 1.5 μm wide and 0.35 μm high becomes a large value based on the foregoing formula.

Figure 20:
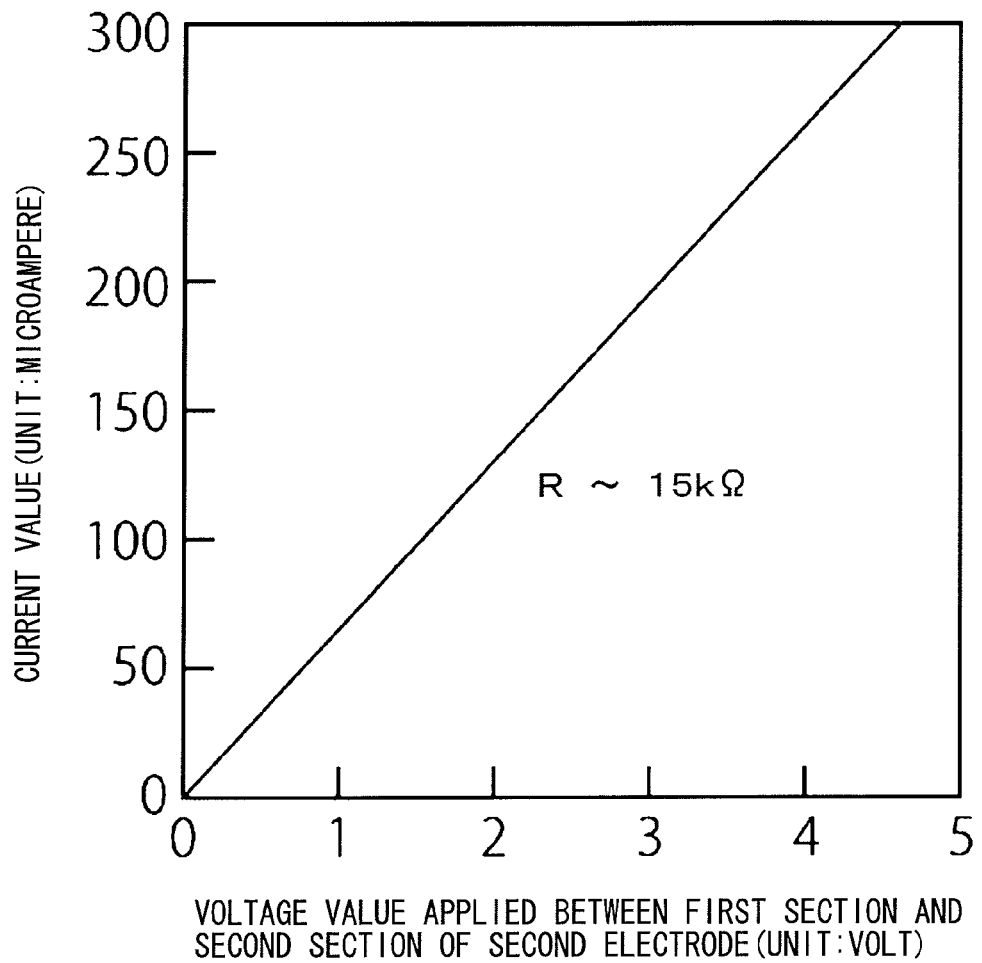
FIG. 20 is a graph illustrating a result obtained by measuring an electric resistance value between a first section and a second section of the second electrode of the obtained mode locking laser diode device obtained in the first example by four terminal method.

FIG. 20 illustrates a result obtained by measuring an electric resistance value between the first section 162A and the second section 162B of the second electrode 162 of the fabricated mode locking laser diode device 110 of the first example by four terminal method. In the case where the width of the isolation trench 162C was 20 μm, the electric resistance value between the first section 162A and the second section 162B of the second electrode 162 was 15 kΩ.

In the fabricated mode locking laser diode device 110 of the first example, forward bias state was obtained by flowing a direct current from the first section 162A of the second electrode 162 to the first electrode 161 through the light emitting region 141, and electric field was added to the saturable absorption region 142 by applying reverse bias voltage $V_{sa}$ between the first electrode 161 and the second section 162B of the second electrode 162, and thereby mode locking drive was performed.

Further, the electric resistance value between the first section 162A and the second section 162B of the second electrode 162 is ten times or more as large as the electric resistance value between the second electrode 162 and the first electrode 161, or $1*10^2$ Ω or more. Thus, flow of leakage current from the first section 162A of the second electrode 162 to the second section 162B of the second electrode 162 is able to be inhibited securely. In the result, the light emitting region 141 is able to be in forward bias state, the saturable absorption region 142 is securely able to be in reverse bias state, and single mode self-pulsation operation and mode locking operation are able to be securely performed.

Further, the semiconductor optical amplifier 200 is able to be manufactured by the same manufacturing method as that of the mode locking laser diode device 110, except that the structure of the second electrode is different. Thus, detailed description thereof will be omitted.

To further deepen understanding of the mode locking laser diode device in the first example, a mode locking laser diode device of a first referential example was fabricated. In the mode locking laser diode device of the first referential example, the structure of the third compound semiconductor layer 140 in the layer structure illustrated in Table 1 was as illustrated in the following Table 2.

TABLE 2

|  | First example | First referential example |
|---|---|---|
| Well layer | 8 nm | 10.5 nm |
| Barrier layer | 12 nm | 14 nm |

TABLE 2-continued

|  | First example | First referential example |
|---|---|---|
| Impurity doping concentration of well layer | Non-doped | Non-doped |
| Impurity doping concentration of barrier layer | Si: $2 * 10^{18}$ cm⁻³ | Non-doped |

In the first example, the thickness of the well layer is 8 nm, the barrier layer is doped with Si at a concentration of Si: $2*10^{18}$ cm⁻³, and QCSE effect in the third compound semiconductor layer is modified. Meanwhile, in the first referential example, the thickness of the well layer is 10.5 nm, and the barrier layer is not doped with impurity.

Figure 17:
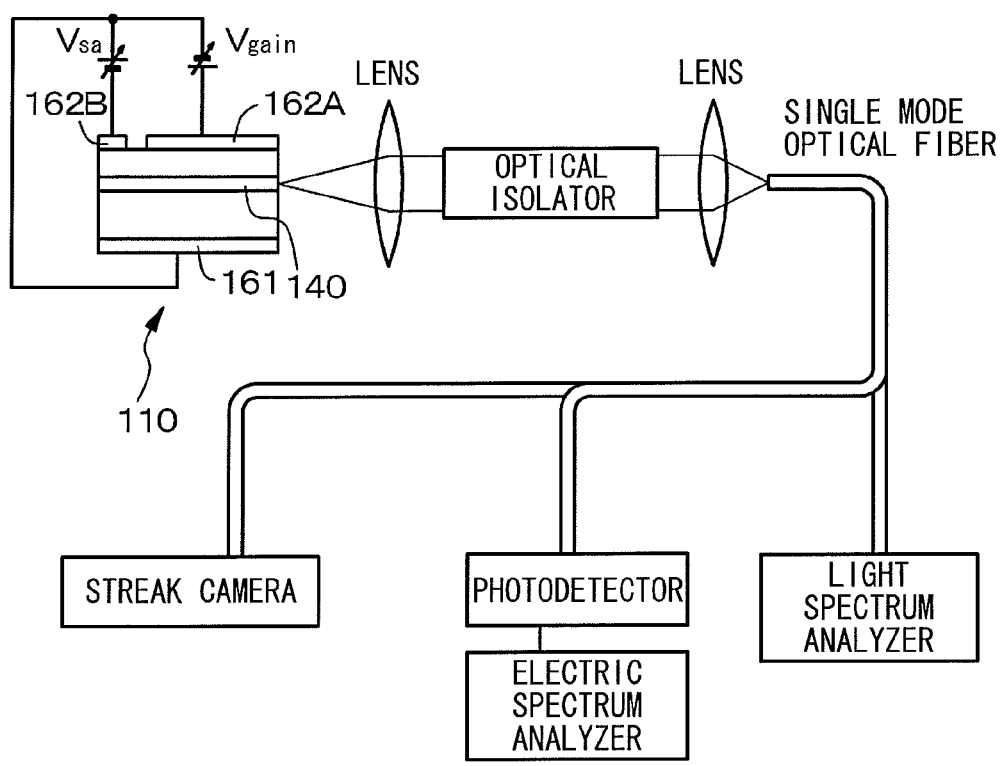
FIG. 17 is a view schematically illustrating a measurement system used for evaluation of self-pulsation operation of the mode locking laser diode device in the first example.

FIG. 17 illustrates a measurement system used for evaluation of the self-pulsation operation of the mode locking laser diode device 110 of the first example. In measurement, the DC constant voltage $V_{sa}$ was applied to the saturable absorption region 142, and DC low current (voltage $V_{gain}$) was flown to the light emitting region (gain region) 141. That is, the negative DC constant voltage $V_{sa}$ was applied to the second section 162B of the second electrode 162, and the DC low current was flown from the first section 162A of the second electrode 162 to the first electrode 161. Laser light outputted from the mode locking laser diode device 110 was collimated with the use of a lens, and was transmitted through an optical isolator. After that, the light was coupled with a single mode fiber with the use of a lens, and light from the single mode fiber was evaluated by using a photodetector, an electric spectrum analyzer, a light spectrum analyzer, and a streak camera.

A light condensing external resonator was formed from the mode locking laser diode devices of the first example and the first referential example, and mode locking driving was performed (refer to FIG. 11A). In the light condensing external resonator illustrated in FIG. 11A, the external resonator is formed from the end face of the mode locking laser diode device in which a high reflective coating layer (HR) is formed on the saturable absorption region side and the external mirror 13, and light pulse is extracted from the external mirror 13. A low reflective coating layer (AR) is formed on the end face (light output end face) of the mode locking laser diode device on the light emitting region (gain region) side. As the optical filter 12, a bandpass filter is mainly used, which is inserted for controlling laser oscillation wavelength. Repetition frequency f of light pulse train is determined by the external resonator length Z' as expressed by the following formula, where c represents light velocity and n represents refractive index of waveguide.

$$f=c/(2n \cdot Z')$$

Figure 18A:
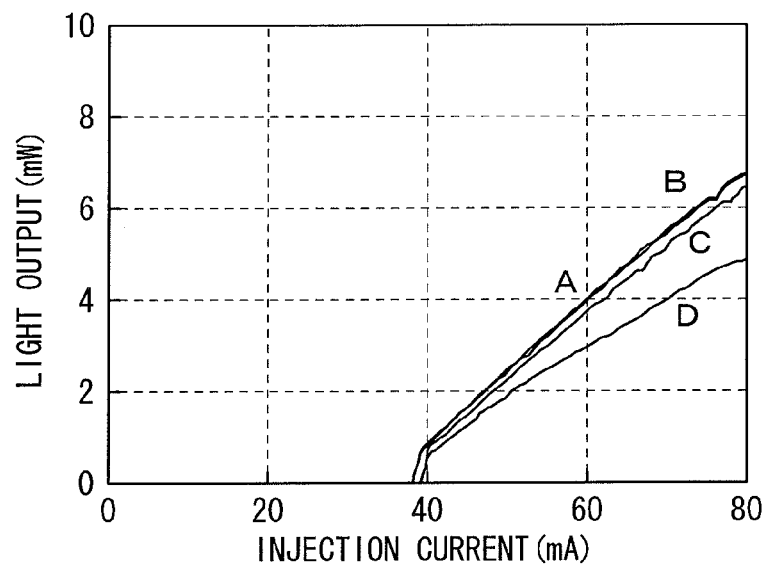
FIGS. 18A and 18B are graphs respectively illustrating reverse bias voltage dependence measurement results of relation between an injection current and light output (L-I characteristics) in the first example and a first referential example.
Figure 18B:
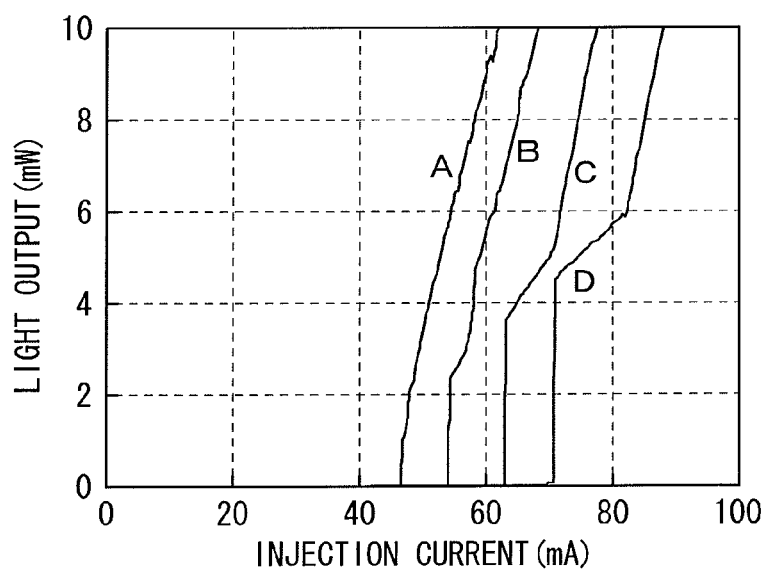

Mode locking is determined by a DC current applied to the light emitting region 141 and the reverse bias voltage $V_{sa}$ applied to the saturable absorption region 142. FIGS. 18A and 18B illustrate reverse bias voltage dependence measurement results of relation between an injection current and light output (L-I characteristics) of the first example and the first referential example. In FIGS. 18A and 18B, measurement results affixed with referential symbol "A" are results in the case of the reverse bias voltage $V_{sa}$=0 volt, measurement results affixed with referential symbol "B" are results in the case of the reverse bias voltage $V_{sa}$=−3 volt, measurement results affixed with referential symbol "C" are results in the case of the reverse bias voltage $V_{sa}$=−6 volt, and measurement results affixed with referential symbol "D" are results in the case of the reverse bias voltage $V_{sa}$=−9 volt. In FIG. 18A, the measurement result in the case of the reverse bias voltage $V_{sa}$=0 volt almost overlaps the measurement result in the case of the reverse bias voltage $V_{sa}$=−3 volt.

Based on comparison between FIGS. 18A and 18B, it is found that in the first referential example, as the reverse bias voltage $V_{sa}$ is increased, the threshold current $I_{th}$ at which laser oscillation is started is gradually increased, and change is shown at lower reverse bias voltage $V_{sa}$ compared to in the first example. It indicates that in the third compound semiconductor layer 140 of the first example, effect of saturable absorption is electrically controlled more by the reverse bias voltage $V_{sa}$.

Figure 19A:
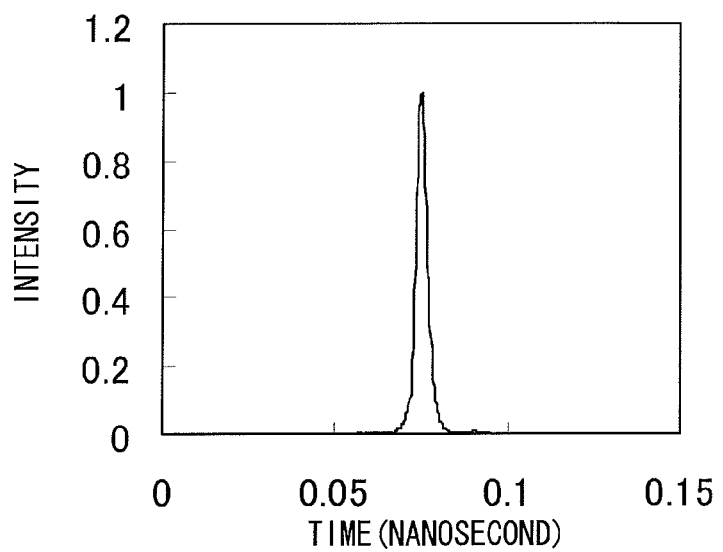
FIGS. 19A and 19B are diagrams respectively illustrating results obtained by measuring light pulse generated in the first example and the first referential example by a streak camera.
Figure 19B:
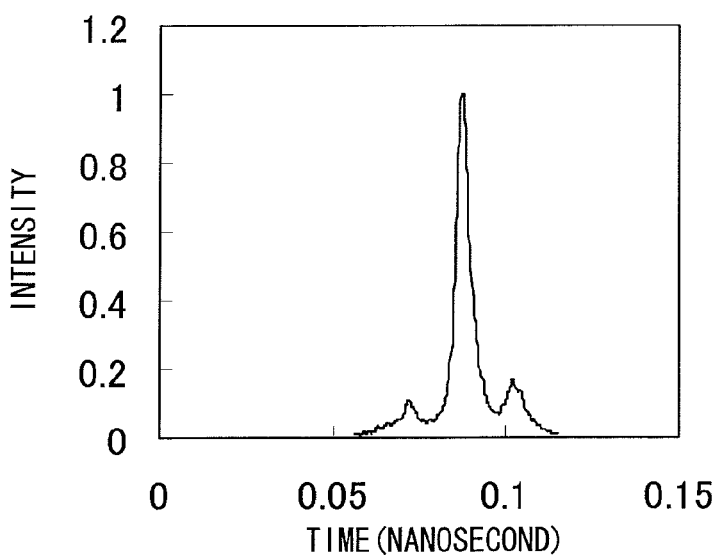

FIGS. 19A and 19B illustrate results obtained by measuring light pulse generated in the first example and the first referential example by a streak camera. In FIG. 19B obtained in the first referential example, subpulse component is generated before and after main pulse. Meanwhile, in FIG. 19A obtained in the first example, subpulse component is inhibited from being generated. The results may be all caused by increased effect of saturable absorption since QCSE effect is moderated by the structure of the third compound semiconductor layer 140.

Drive conditions and the like of the mode locking laser diode device of the first example illustrated in FIG. 11A are exemplified in the following Table 3. $I_{th}$ represents a threshold current.

TABLE 3

Mode locking drive conditions:
$0 < 1_{gain}/I_{th} \leq 5$
$-20 \leq V_{sa}$ (volt) $\leq 0$
High reflective coating layer (HR):
$85 \leq$ reflectance $R_{HR}$ (%) $< 100$
Low reflective coating layer (AR):
$0 <$ reflectance $R_{AR}$ (%) $\leq 0.5$
Optical filter:
$85 \leq$ transmittance $T_{BPF}$ (%) $< 100$
$0 <$ half bandwidth $\tau_{BPF}$ (nm) $\leq 2.0$
$400 <$ peak wavelength $\lambda_{BPF}$ (nm) $< 450$
External mirror:
$0 <$ reflectance $R_{OC}$ (%) $< 100$
External resonator length Z'
$0 < Z'$ (mm) $< 1500$ More specifically, in the first example, the following conditions were adopted as an example:
$1_{gain}$: 120 mA
$I_{th}$: 45 mA
Reverse bias voltage $V_{sa}$: −11 (volt)
Reflectance $R_{HR}$: 95%
Reflectance $R_{AR}$: 0.3%
Transmittance $T_{BPF}$: 90%
Half bandwidth $\tau_{BPF}$: 1 nm
Peak wavelength $\lambda_{BPF}$: 410 nm
Reflectance $R_{OC}$: 20%
External resonator length Z': 150 mm Meanwhile, in the first referential example, the same conditions as those of the first example were adopted except for the following conditions:
$I_{gain}$: 95 mA
$I_{th}$: 50 mA
Reverse bias voltage $V_{sa}$: −12.5 (volt)
Reflectance $R_{OC}$: 50%

Second Example

Figure 7A:
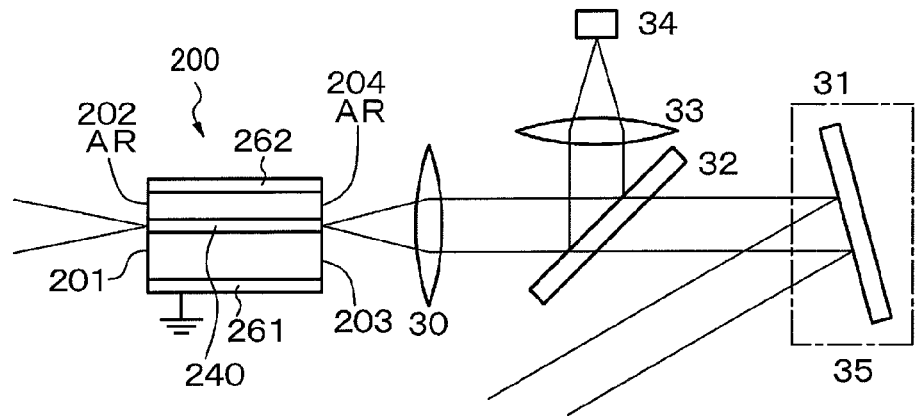
FIG. 7A is a conceptual view of a light output device of a second example.

The second example is a modification of the first example. In the second example, as illustrated in the conceptual view of FIG. 7A, part of light output of laser light outputted from the semiconductor optical amplifier 200 is taken out by using a beam splitter 32, and such light enters a photodiode 34 through a lens 33. Thereby, the light output of the laser light outputted from the semiconductor optical amplifier 200 is measured. In the case where the light output is changed from a desired value, the alignment method of the semiconductor optical amplifier of the first example is executed again. That is, the relative position of the semiconductor optical amplifier 200 with respect to laser light entering the semiconductor optical amplifier 200 is readjusted by flowing a given value of current to the semiconductor optical amplifier 200 while entering the laser light from the laser light source 100 to the semiconductor optical amplifier 200 so that a voltage applied to (added to) the semiconductor optical amplifier 200 becomes the maximum. In the case where result of the readjustment of the relative position of the semiconductor optical amplifier 200 with respect to the laser light entering the semiconductor optical amplifier 200 is the same as the relative position of the semiconductor optical amplifier 200 with respect to laser light entering the semiconductor optical amplifier 200 before readjustment, light path through which the laser light outputted from the semiconductor optical amplifier 200 passes is adjusted. Such an adjustment may be performed by laying a reflecting mirror 31 on an XYZ stage 35. The XYZ stage 35 may be moved by an operator. Otherwise, the XYZ stage 35 is able to be automatically moved by direction of the semiconductor optical amplifier control device 400 based on measurement result of the voltage and the photodiode 34. In FIG. 7A, the components of the light output device located in upper stream than the semiconductor optical amplifier 200 are the same as the components of the light output device of the first example. Thus, the components of the light output device in FIG. 7A are not illustrated.

Except for the foregoing point, the alignment method of a semiconductor optical amplifier and the light output device of the second example are similar to the alignment method of a semiconductor optical amplifier and the light output device of the first example. Thus, detailed description thereof will be omitted. According to the second example, in the case where change of monitor of light output is generated, it is able to easily determine whether or not such change is caused by relative position change of the semiconductor optical amplifier 200 with respect to the laser light entering the semiconductor optical amplifier 200 (that is, change of coupling efficiency between the incident laser light and light waveguide of the semiconductor optical amplifier).

Third Example

The third example relates to the alignment method of a semiconductor optical amplifier according to the second embodiment of the invention and the light output device according to the second embodiment of the invention. A composition and a configuration of the light output device and the semiconductor optical amplifier of the third example are the same as those of the light output device whose conceptual view is illustrated in FIG. 1 and the semiconductor optical amplifier of the first example, and thus detailed description thereof will be omitted.

In the alignment method of a semiconductor optical amplifier or the light output device of the third example, a given value of voltage is applied to the semiconductor optical amplifier 200 while laser light enters the semiconductor optical amplifier 200 from the laser light source 100. The relative position of the semiconductor optical amplifier 200 with respect to the laser light entering the semiconductor optical amplifier 200 is adjusted so that a current flown in the semiconductor optical amplifier 200 becomes the maximum. Further, in the light output device of the third example, a given value of voltage is applied to the semiconductor optical amplifier 200 while laser light enters the semiconductor optical amplifier 200 from the laser light source 100, a current flown in the semiconductor optical amplifier 200 is monitored by the semiconductor optical amplifier control device 400. The relative position of the semiconductor optical amplifier 200 with respect to laser light entering the semiconductor optical amplifier 200 is adjusted so that the current flown in the semiconductor optical amplifier 200 becomes the maximum by the alignment device 300.

More specifically, in the alignment method of the semiconductor optical amplifier 200 of the third example, when a current flown in the semiconductor optical amplifier 200 in the case where a given value of voltage $V_0$ is applied to the semiconductor optical amplifier 200 while laser light does not enter the semiconductor optical amplifier 200 from the laser light source 100 is $I_1$, and a current flown in the semiconductor optical amplifier 200 in the case where a given value of voltage $V_0$ is applied to the semiconductor optical amplifier 200 while laser light enters the semiconductor optical amplifier 200 from the laser light source 100 is $I_2$, the relative position of the semiconductor optical amplifier 200 with respect to laser light entering the semiconductor optical amplifier 200 is adjusted so that value of $\Delta I=(I_2-I_1)$ becomes the maximum.

Further, in the light output device of the third example, when a current flown in the semiconductor optical amplifier 200 in the case where a given value of voltage $V_0$ is applied to the semiconductor optical amplifier 200 while laser light does not enter the semiconductor optical amplifier 200 from the laser light source 100 is $I_1$, and a current flown in the semiconductor optical amplifier 200 in the case where a given value of voltage $V_0$ is applied to the semiconductor optical amplifier 200 while laser light enters the semiconductor optical amplifier 200 from the laser light source 100 is $I_2$, the relative position of the semiconductor optical amplifier 200 with respect to laser light entering the semiconductor optical amplifier 200 is adjusted so that value of $\Delta I=(I_2-I_1)$ becomes the maximum by the alignment device.

Change of the current $\Delta I$ flown in the semiconductor optical amplifier 200 in the case where a given value of voltage is applied to the semiconductor optical amplifier 200 while laser light enters the semiconductor optical amplifier 200 from the laser light source 100 and the XYZ stage is moved in the X direction is substantially similar to the change illustrated in FIG. 5. That is, along with movement of the XYZ stage in the X direction, the current $\Delta I$ flown in the semiconductor optical amplifier 200 is flatly increased until $\Delta I$ exceeds the maximum value, and is flatly decreased. Change of light output of laser light outputted from the semiconductor optical amplifier 200 at this time shows the totally same behavior as that of change of the current. Thus, the relative position of the semiconductor optical amplifier 200 with respect to the laser light entering the semiconductor optical amplifier 200 is adjusted so that the current flown in the semiconductor optical amplifier 200 becomes the maximum, and thereby light output of laser light outputted from the semiconductor optical amplifier 200 is able to be the maximum.

Fourth Example

The fourth example is a modification of the third example. The light output device of the fourth example has the same composition and the same structure as those of the light output device of the second example illustrated in the conceptual view of FIG. 7A. As in the second example, in the fourth example, part of light output of laser light outputted from the semiconductor optical amplifier 200 is extracted by using the beam splitter 32, and such light enters the photodiode 34 through the lens 33. Thereby, the light output of the laser light outputted from the semiconductor optical amplifier 200 is measured. In the case where the light output is changed from a desired value, the alignment method of the semiconductor optical amplifier of the third example is executed again. That is, the relative position of the semiconductor optical amplifier 200 with respect to laser light entering the semiconductor optical amplifier 200 is readjusted by applying a given value of voltage to the semiconductor optical amplifier 200 while entering the laser light from the laser light source 100 to the semiconductor optical amplifier 200 so that a current flown in the semiconductor optical amplifier 200 becomes the maximum. In the case where result of the readjustment of the relative position of the semiconductor optical amplifier 200 with respect to the laser light entering the semiconductor optical amplifier 200 is the same as the relative position of the semiconductor optical amplifier 200 with respect to the laser light entering the semiconductor optical amplifier 200 before readjustment, light path through which the laser light outputted from the semiconductor optical amplifier 200 passes is adjusted. As in the second example, such an adjustment may be performed by, for example, placing the reflecting mirror 31 on the XYZ stage 35. The XYZ stage 35 may be moved by an operator. Otherwise, the XYZ stage 35 is able to be automatically moved by direction of the semiconductor optical amplifier control device 400 based on measurement result of the current and the photodiode 34.

Except for the foregoing point, the alignment method of a semiconductor optical amplifier and the light output device of the fourth example may be similar to the alignment method of a semiconductor optical amplifier and the light output device of the third example. Thus, detailed description thereof will be omitted. According to the fourth example, in the case where change of monitor of light output is generated, it is able to easily determine whether or not such change is caused by relative position change of the semiconductor optical amplifier 200 with respect to the laser light entering the semiconductor optical amplifier 200 (that is, change of coupling efficiency between the incident laser light and light waveguide of the semiconductor optical amplifier).

Fifth Example

Figure 8:
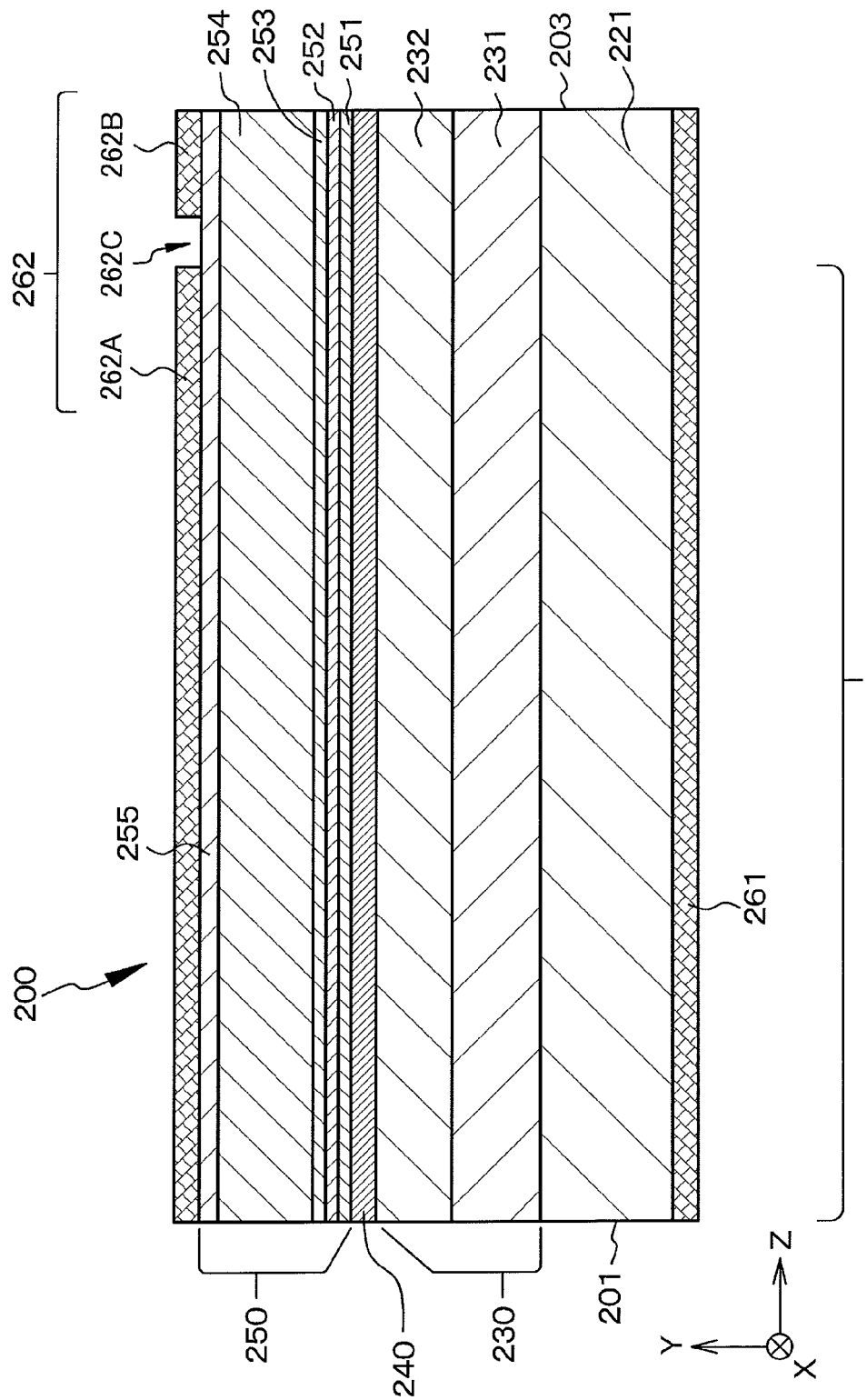
FIG. 8 is a schematic cross sectional view of a semiconductor optical amplifier where the semiconductor optical amplifier is cut along a virtual vertical plane (YZ plane) including an axis line (Z direction) of the semiconductor optical amplifier of the fifth example.

The fifth example is a modification of the third example and the fourth example. In the fifth example, as FIG. 8 illustrates a schematic cross sectional view of the semiconductor optical amplifier where the semiconductor optical amplifier is cut along a virtual vertical plane (YZ plane) including an axis line (Z direction) of the semiconductor optical amplifier, differently from the third example, the second electrode 262 is composed of a first section 262A and a second section 262B that is provided on the light output end face 203 side of the semiconductor optical amplifier 200 and is separated from the first section 262A by an isolation trench 262C. Where the length of the first section 262A is $L_{Amp-1}$ and the length of the second section 262B is $L_{Amp-2}$, $L_{Amp-1}$ is 1.98 mm, $L_{Amp-2}$ is 0.01 mm, and $0.001 \le L_{Amp-2}/L_{Amp-1} \le 0.01$ is satisfied. Further, the length of the isolation trench 262C is 0.01 mm. The second section 262B is located on the light output end face side of the semiconductor optical amplifier 200. A voltage applied to the second section 262B of the second electrode 262 is any of values from −20 volt to 4 volt both inclusive such as 1 volt. In the fifth example, the second electrode 262 is divided into two sections as above, and thereby deterioration of the light output end face 203 of the semiconductor optical amplifier 200 is able to be inhibited. Light amplification as an inherent function of the semiconductor optical amplifier 200 is performed by applying a voltage to the first section 262A of the second electrode 262, while measurement for position adjustment is performed by applying a voltage to the second section 262B of the second electrode 262. Thus, measurement of the current $\Delta I$ is performed for a current flowing in the second section 262B of the second electrode 262.

Except for the foregoing point, a composition and a configuration of the light output device and the semiconductor optical amplifier of the fifth example may be similar to those of the light output device and the semiconductor optical amplifier of the third example or the fourth example. Thus, the description thereof will be omitted.

Sixth Example

Figure 11B:
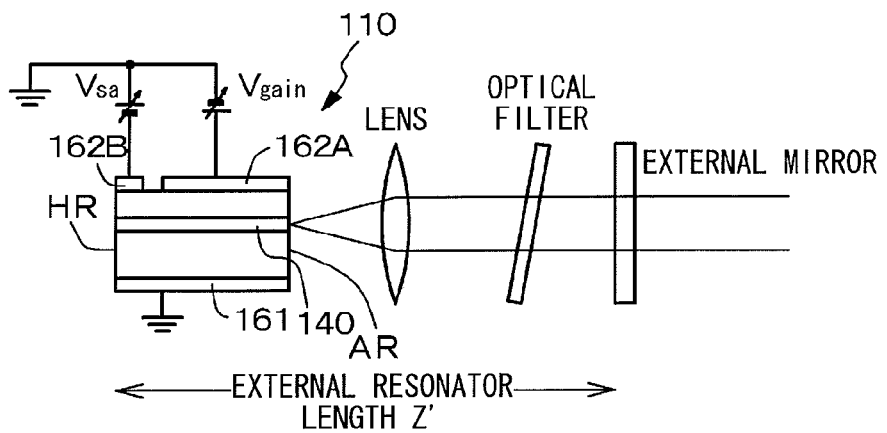
Figure 12A:
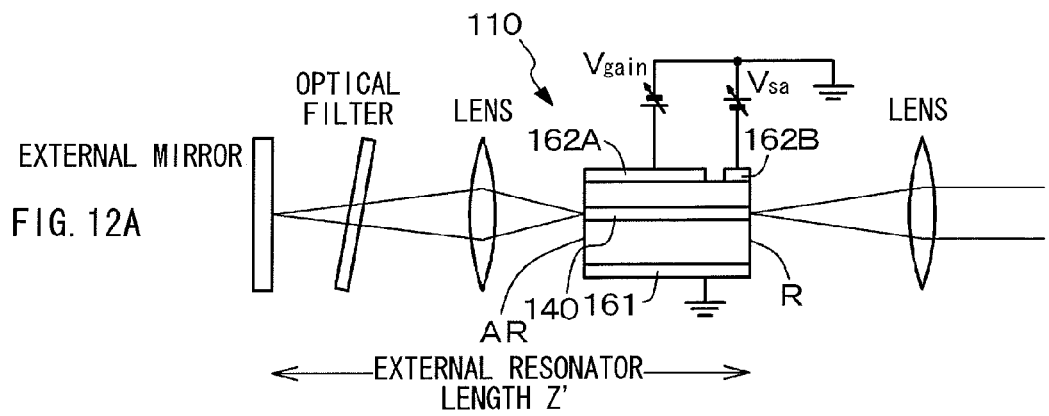
FIGS. 12A and 12B are views that respectively and schematically illustrate a system of performing mode locking drive by forming an external resonator from the mode locking laser diode device of the sixth example.
Figure 12B:
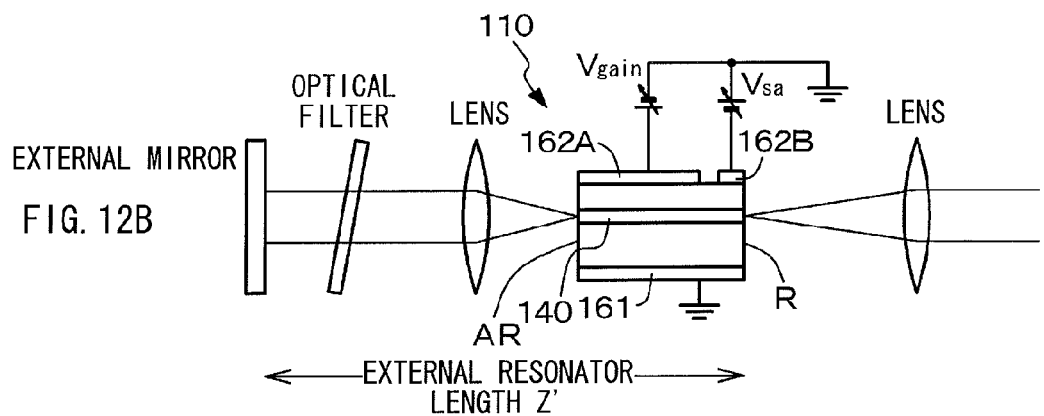

The sixth example is a modification of the mode locking laser diode device in the first example. FIGS. 11B, 12A, and 12B illustrate an example in which an external resonator is configured by the mode locking laser diode device of the sixth example.

In the collimation type external resonator illustrated in FIG. 11B, the external resonator is formed from the end face of the mode locking laser diode device in which a high reflective coating layer (HR) is formed on the saturable absorption region side and the external mirror, and light pulse is extracted from the external mirror. A low reflective coating layer (AR) is formed on the end face (light output end face) of the mode locking laser diode device on the light emitting region (gain region) side. The drive conditions and the like of the mode locking laser diode device of the sixth example illustrated in FIG. 11B are similar to those of the foregoing Table 3.

Meanwhile, in the external resonator illustrated in FIGS. 12A and 12B, the external resonator is formed from the end face of the mode locking laser diode device in which a reflective coating layer (R) is formed on the saturable absorption region side (light output end face) and the external mirror, and light pulse is extracted from the saturable absorption region 142. A low reflective coating layer (AR) is formed on the end face of the mode locking laser diode device on the light emitting region (gain region) side. The example illustrated in FIG. 12A is light condensing type, and the example illustrated in FIG. 12B is collimation type. The drive conditions and the like of the mode locking laser diode device of the sixth example illustrated in FIGS. 12A and 12B are similar to those of the foregoing Table 3. However, the reflective coating layer (R) may be as illustrated in the following Table 4.
Table 4
Reflective coating layer (R)
0<reflectance $R_R$ (%)<100

Specifically, reflectance $R_R$ was set to 20%. Other composition and other structure of the mode locking laser diode device in the sixth example are the same as the composition and the structure of the mode locking laser diode device described in the first example, and thus detailed description thereof will be omitted.

Seventh Example

Figure 12C:
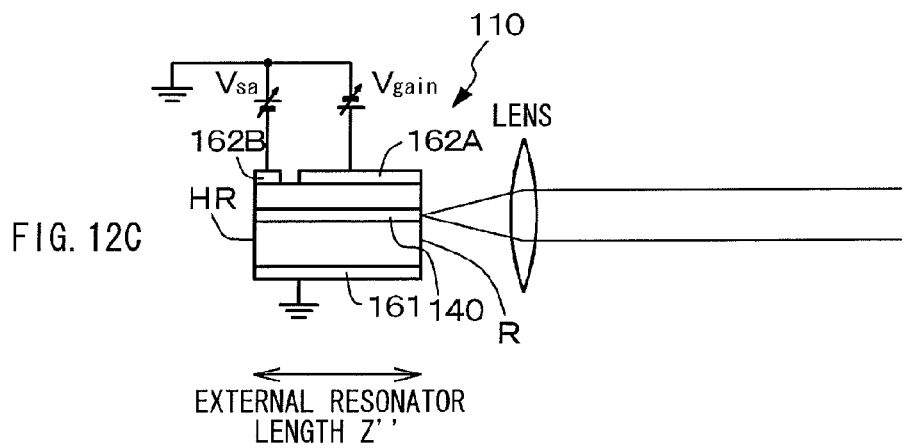
FIG. 12C is a view that schematically illustrates a system of performing mode locking drive by using a mode locking laser diode device of a seventh example.

The seventh example is also a modification of the mode locking laser diode device in the first example. In the seventh example, as illustrated in FIG. 12C, the mode locking laser diode device is monolithic type. The drive conditions and the like of the mode locking laser diode device of the seventh example are similar to those of the foregoing Table 3. Other composition and other structure of the mode locking laser diode device in the seventh example are able to be similar to the composition and the structure of the mode locking laser diode device described in the first example, and thus detailed description thereof will be omitted.

Eighth Example

Figure 13:
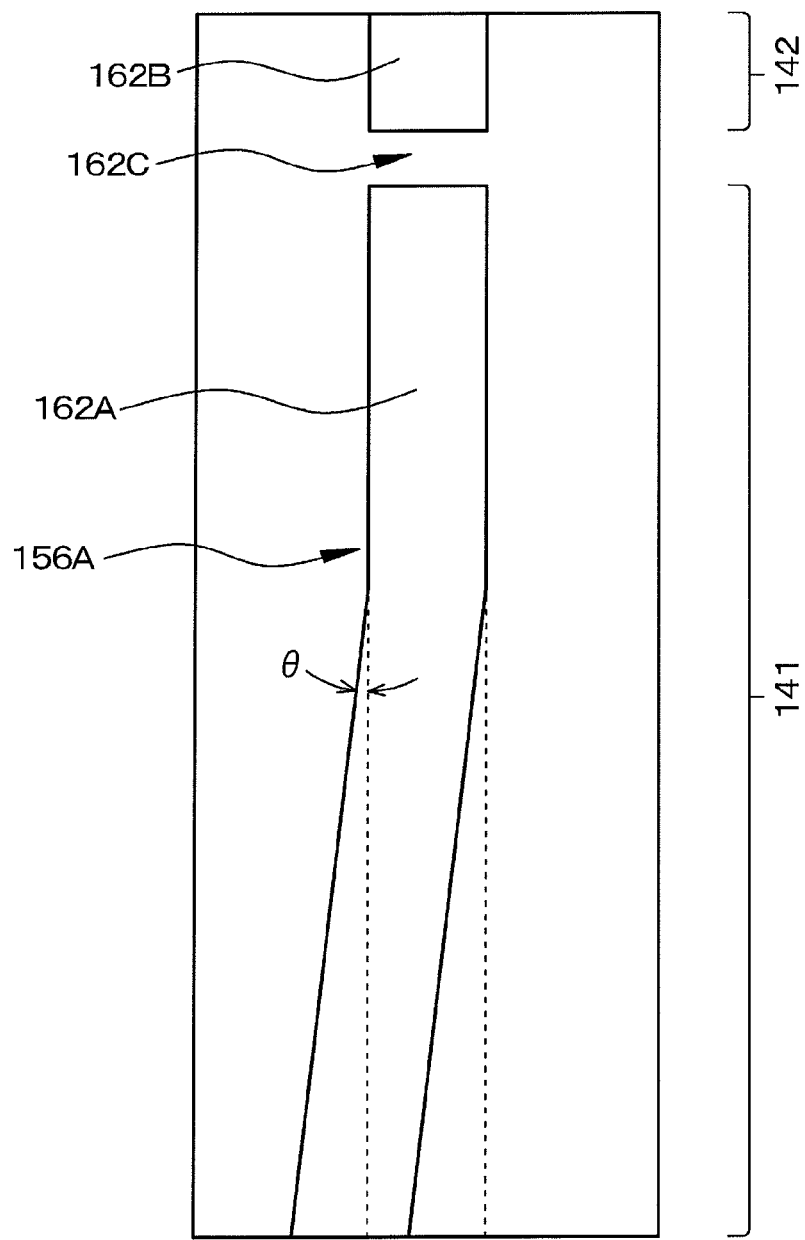
FIG. 13 is a schematic view viewed from above of a ridge section in a mode locking laser diode device of an eighth example.

The eighth example is also a modification of the mode locking laser diode device in the first example. The mode locking laser diode device of the eighth example is a laser diode device having a ridge stripe type separate confinement heterostructure with oblique light waveguide. FIG. 13 illustrates a schematic view viewed from above of a ridge section 156A in the mode locking laser diode device of the eighth example. The mode locking laser diode device of the eighth example has a structure in which two straight line-like ridge sections are combined. A value of angle θ of intersection of the two ridge sections desirably satisfies, for example, 0<θ≤10 (deg), and preferably satisfies 0<θ≤6 (deg). By adopting the oblique ridge stripe type, reflectance of the end face provided with low reflective coating is able to be closer to 0% as the ideal value. In the result, generation of light pulse that would revolve in the laser diode device is able to be prevented, and generation of sub-light pulse associated with main light pulse is able to be inhibited. The oblique ridge stripe type mode locking laser diode device of the eighth example is applicable to the first example, the sixth example, and the seventh example. Other composition and other structure of the mode locking laser diode device in the eighth example are similar to the composition and the structure of the mode locking laser diode device described in the first example, and thus detailed description thereof will be omitted.

Ninth Example

Figure 14A:
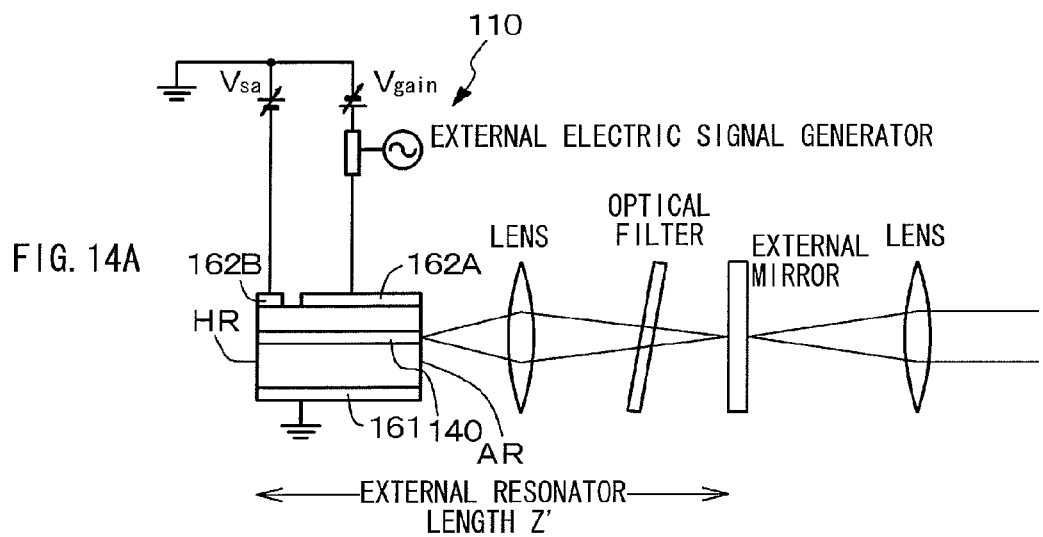
FIGS. 14A and 14B are views that respectively and schematically illustrate a system of performing mode locking drive by using mode locking laser diode devices of a ninth example and a tenth example.

The ninth example is also a modification of the mode locking laser diode device in the first example. In the ninth example, a current is flown from the second electrode 162 to the first electrode 161 through the light emitting region 141, and an external electric signal (RMS jitter $\Delta_{signal}$) is superimposed on the first electrode 161 from the second electrode 162 through the light emitting region 141. FIG. 14A schematically illustrates a system of performing mode locking drive by using the mode locking laser diode device of the ninth example. The external electric signal is sent from a known external electric signal generator to the second electrode 162. Thereby, light pulse is able to be sync with the external electric signal. That is, RMS timing jitter $\Delta t_{MILD}$ is able to be kept down as the following formula: $\Delta_{signal} \leq \Delta t_{MILD}$.

The drive conditions and the like of the mode locking laser diode device of the ninth example illustrated in FIG. 14A are able to be similar to those of the foregoing Table 3. Voltage maximum value $V_{p-p}$ (unit: volt) of the external electric signal desirably satisfies $0<V_{p-p}\leq 10$, and preferably satisfies $0<V_{p-p}\leq 3$. Further, frequency $f_{signal}$ of the external electric signal and repetition frequency $f_{MILD}$ of a light pulse train desirably satisfy $0.99 \leq f_{signal}/f_{MILD} \leq 1.01$.

More specifically, in the ninth example, the following conditions were adopted as an example:
$I_{gain}$: 120 mA
$I_{th}$: 45 mA
Reverse bias voltage $V_{sa}$: −11 (volt)
Reflectance $R_{HR}$: 95%

Figure 21A:
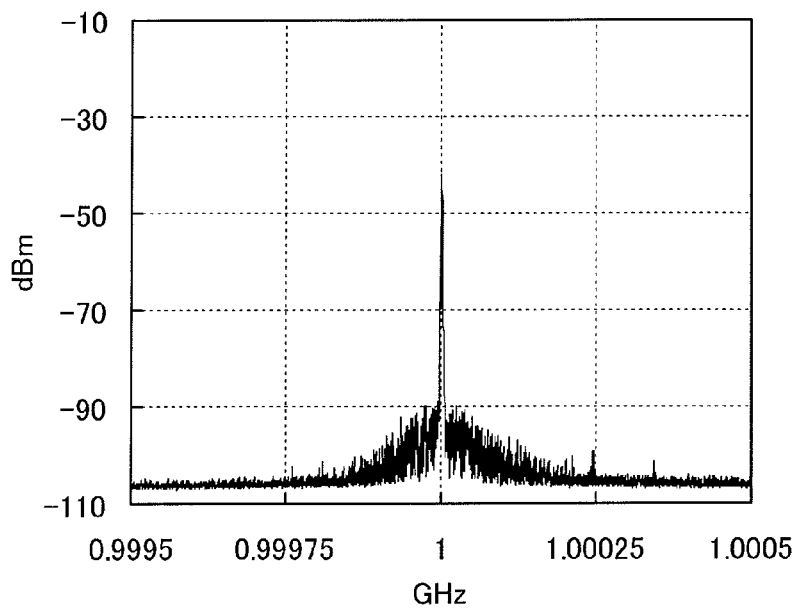
FIGS. 21A and 21B are graphs respectively illustrating measurement results of RF spectrums of the ninth example and a ninth referential example.
Figure 21B:
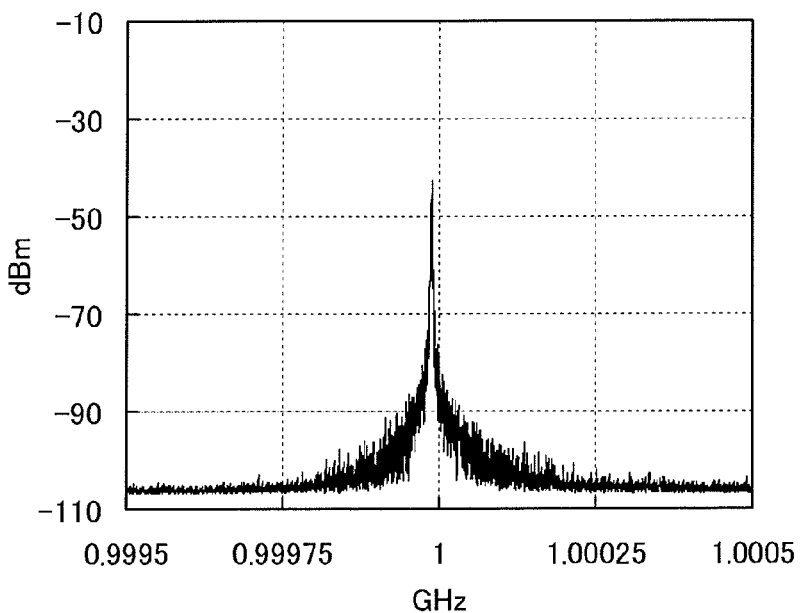

Reflectance $R_{AR}$: 0.3%
Transmittance $T_{BPF}$: 90%
Half bandwidth $\tau_{BPF}$: 1 nm
Peak wavelength $\lambda_{BPF}$: 410 nm
Reflectance $R_{OC}$: 20%
External resonator length Z': 150 mm
$V_{p-p}$: 2.8 volt
$f_{signal}$: 1 GHz
$f_{MILD}$: 1 GHz
$\Delta_{signal}$: 1 picosecond
$\Delta t_{MILD}$: 1.5 picosecond Meanwhile, in a ninth referential example, a current was flown from the second electrode 162 to the first electrode 161 through the light emitting region 141 without superimposing an external electric signal on the first electrode 161 from the second electrode 162 through the light emitting region 141. RF spectrum was measured. FIGS. 21A and 21B illustrate measurement results in the ninth example and the ninth referential example. In the ninth referential example, the same conditions as those of the ninth example were adopted except for the following conditions:

Reflectance $R_{OC}$: 50%

FIGS. 21A and 21B show that in the ninth example, the area of bottom component of RF spectrum is decreased more than in the ninth referential example. Such a fact shows that the ninth example is a drive method in which the phase noise and the timing jitter are smaller compared to the ninth referential example.

Other composition and other structure of the mode locking laser diode device in the ninth example are similar to the composition and the structure of the mode locking laser diode device described in the first example, the sixth example, the seventh example, and the eighth example, and thus detailed description thereof will be omitted.

Tenth Example

Figure 14B:
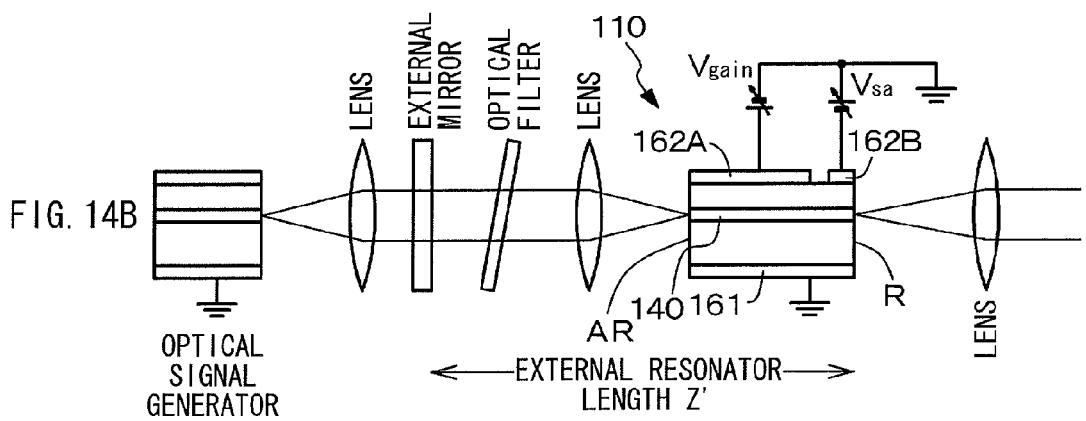

The tenth example is also a modification of the mode locking laser diode device in the first example. In the tenth example, an optical signal enters from one end face of the laminated structure. FIG. 14B schematically illustrates a system of performing mode locking drive by using the mode locking laser diode device of the tenth example. The optical signal (RMS jitter: $\Delta_{opto}$) is outputted from an optical signal generator composed of the laser diode device, and enters one end face of the laminated structure through a lens, an external mirror, an optical filter, and a lens. Thereby, light pulse is able to be sync with the optical signal. That is, the RMS timing jitter $\Delta t_{MILD}$ is able to be kept down as the following formula.

$\Delta_{opto} \leq \Delta t_{MILD}$.

Other composition and other structure of the mode locking laser diode device in the tenth example are similar to the composition and the structure of the mode locking laser diode device described in the first example, the sixth example, the seventh example, and the eighth example, and thus detailed description thereof will be omitted.

Descriptions have been hereinbefore given of the invention based on the preferred examples. However, the invention is not limited to the foregoing examples. The compositions and the structures of the semiconductor optical amplifier, the light output device, the laser light source, and the laser diode device described in the examples are just exemplified, and modifications may be made as appropriate. Further, in the examples, though various values have been shown, such various values are just exemplified as well, and thus it is needless to say that, for example, if specifications of the semiconductor optical amplifier, the light output device, and the laser diode device to be used are changed, values are also changed. For example, the second electrode 162 may have a laminated structure including a lower metal layer composed of palladium (Pd) having a thickness of 20 nm and an upper metal layer composed of nickel (Ni) having a thickness of 200 nm. In performing wet etching with the use of aqua regia, the etching rate of nickel is about 1.25 times as large as the etching rate of palladium.

Figure 7B:
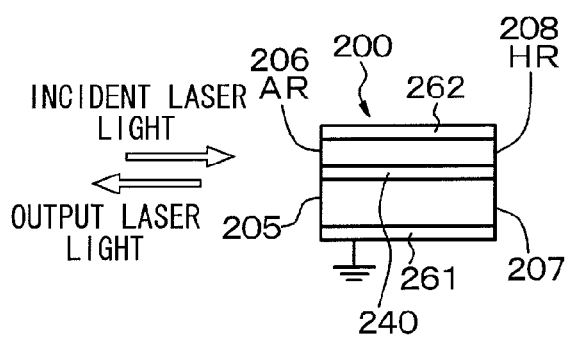
FIGS. 7B, 7C, and 7D are respectively conceptual views of a reflective semiconductor optical amplifier, a resonance semiconductor optical amplifier, and a monolithic semiconductor optical amplifier.
Figure 7C:
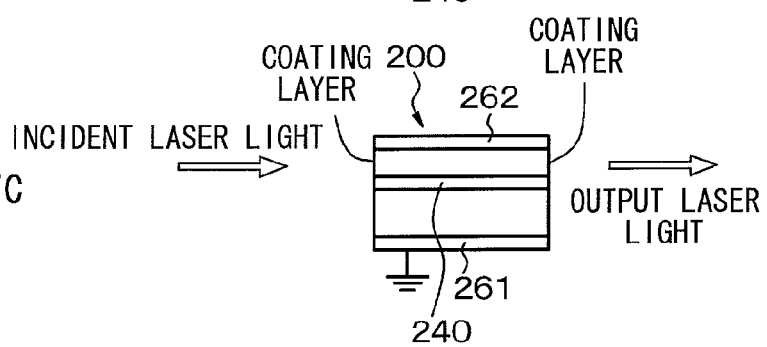
Figure 7D:
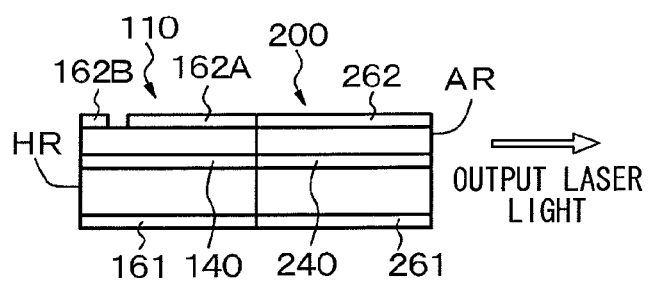
Figure 9A:
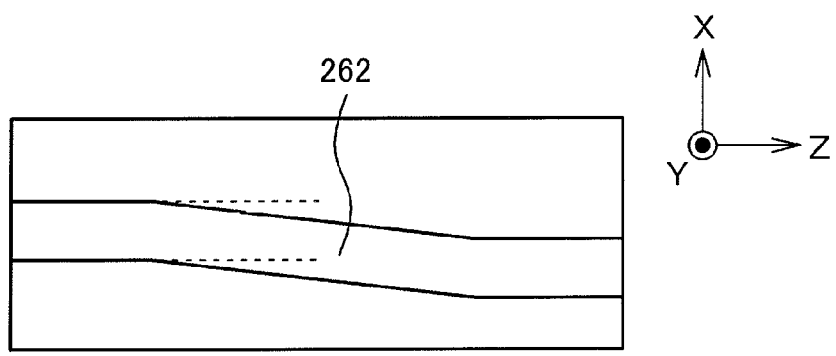
FIGS. 9A and 9B are respectively schematic views viewed from above of a semiconductor optical amplifier adopting an oblique light waveguide structure and a semiconductor optical amplifier adopting flare type as a second electrode structure on the light output end face side.
Figure 9B:
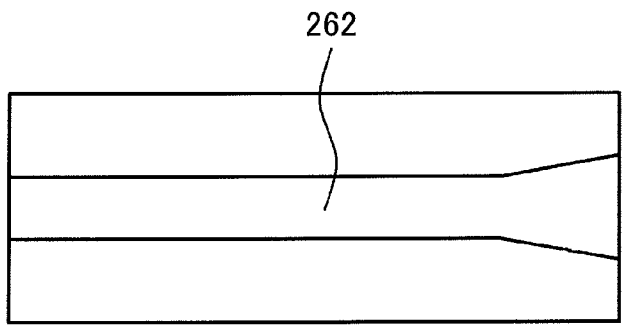

In the examples, the semiconductor optical amplifier is composed of a transmissive semiconductor optical amplifier. However, the semiconductor optical amplifier is not limited thereto. As illustrated in the conceptual views of FIGS. 7B, 7C, and 7D, the semiconductor optical amplifier may be composed of a reflective semiconductor optical amplifier, a resonance semiconductor optical amplifier, or a monolithic semiconductor optical amplifier. In the reflective semiconductor optical amplifier, as illustrated in FIG. 7B, a low reflective coating layer (AR) 206 is formed on one end face (light entrance and output end face) 205 of the semiconductor optical amplifier 200, and a high reflective coating layer (HR) 208 is formed on the other opposing end face 207. Laser light entering from one end face 205 is optically amplified in the semiconductor optical amplifier 200, is reflected by the end face 207 on the opposite side thereof, passes inside the semiconductor optical amplifier 200 again, is optically amplified, and is outputted from the other end face 205. The laser light outputted from the semiconductor optical amplifier 200 and laser light entering the semiconductor optical amplifier 200 are isolated by an appropriate optical part (for example, a beam splitter and a half mirror). Comparing a reflective semiconductor optical amplifier to a transmissive semiconductor optical amplifier that have the same device length, the reflective semiconductor optical amplifier has an amplification path twice that of the transmissive semiconductor optical amplifier, and thus the reflective semiconductor optical amplifier is able to achieve higher amplification. However, the reflective semiconductor optical amplifier needs an optical part to isolate input laser light from output laser light. In the resonance semiconductor optical amplifier, as illustrated in FIG. 7C, both end faces are provided with coating having appropriate reflectance, laser light resonates inside the resonance semiconductor optical amplifier and is amplified. If the reflectance of the coating is excessively high, laser oscillation is made. Thus, it is necessary to adjust the reflectance to make the resonance semiconductor optical amplifier as an optical amplifier. The monolithic semiconductor optical amplifier is, as illustrated in FIG. 7D, an integrated body composed of a laser diode device and a semiconductor optical amplifier. Further, as illustrated in FIGS. 9A and 9B, it is possible to adopt an oblique light waveguide structure on the light entrance end face side and/or the light output end face side in order to decrease the reflectance on the end face of the semiconductor optical amplifier, or it is possible to adopt flare type as a second electrode on the light output end face side in order to improve the gain.

In the examples, the mode locking laser diode device 110 is provided on the {0001} plane, which is the C plane as the polarity plane of the n-type GaN substrate 121. Alternately, the mode locking laser diode device 110 may be provided on A plane as {11-20} plane, M plane as {1-100} plane, non-polarity plane such as {1-102} plane, {11-2n} plane including {11-24} plane and {11-22} plane, or a semi-polarity plane such as {10-11} plane and {10-12} plane. Even if piezoelectric polarization or intrinsic polarization is thereby generated in the third compound semiconductor layer of the mode locking laser diode device 110, piezoelectric polarization is not generated in the thickness direction of the third compound semiconductor layer and piezoelectric polarization is generated in the direction approximately orthogonal to the thickness direction of the third compound semiconductor layer. Thus, adverse effect resulting from piezoelectric polarization and intrinsic polarization is able to be excluded. {11-2n} plane means a non-polarity plane making 40 deg approximately with respect to the C plane. In the case where the mode locking laser diode device 110 is provided on a non-polarity plane or on a semi-polarity plane, limitation of the thickness of the well layer (from 1 nm to 10 nm both inclusive) and limitation of the impurity doping concentration of the barrier layer (from $2*10^{18}$ cm$^{-3}$ to $1*10^{20}$ cm$^{-3}$ both inclusive) are able to be eliminated.

Figure 15:
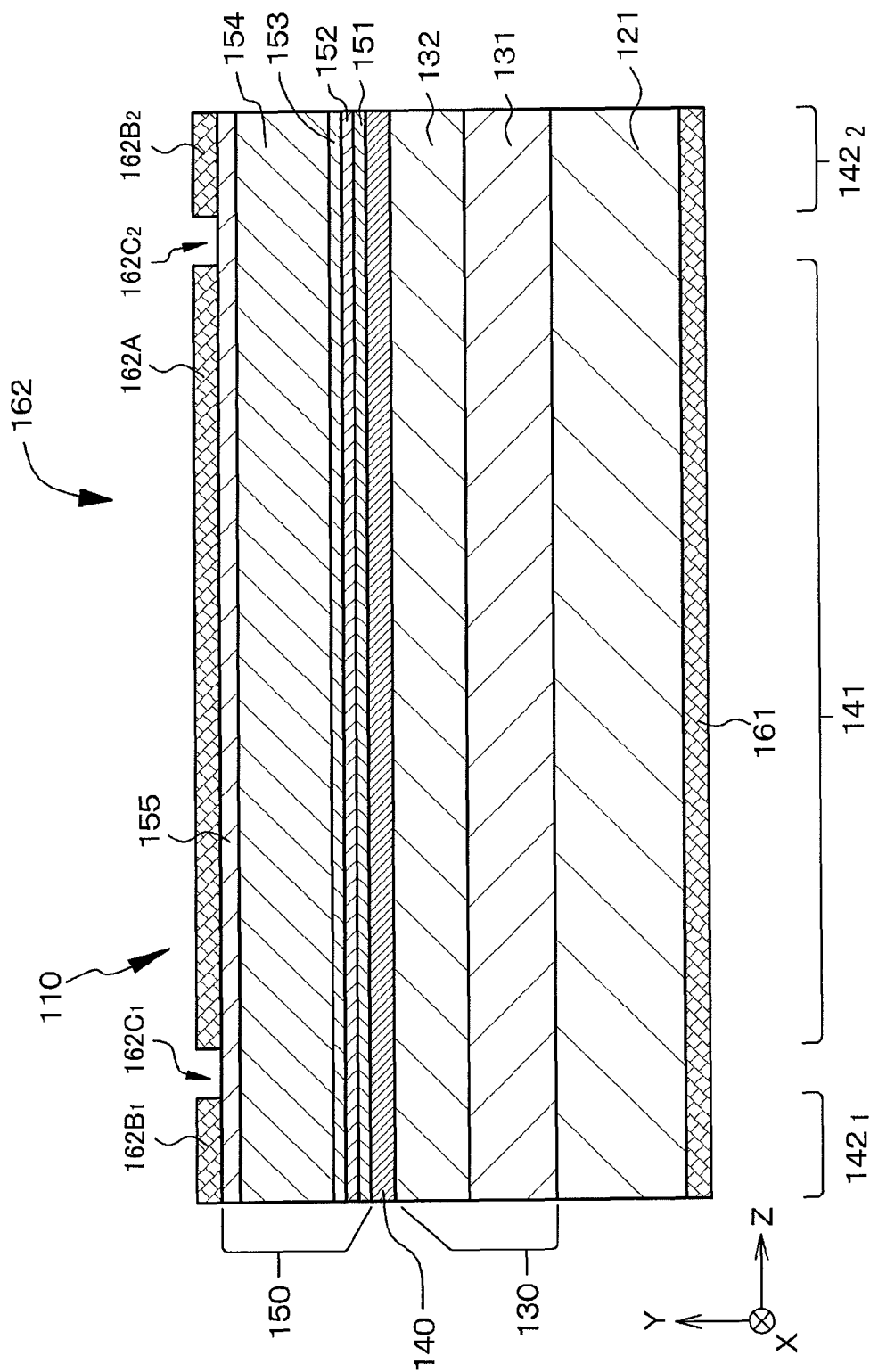
FIG. 15 is a schematic end view taken along a direction in which a resonator of a modification of the mode locking laser diode device in the first example is extended.
Figure 16:
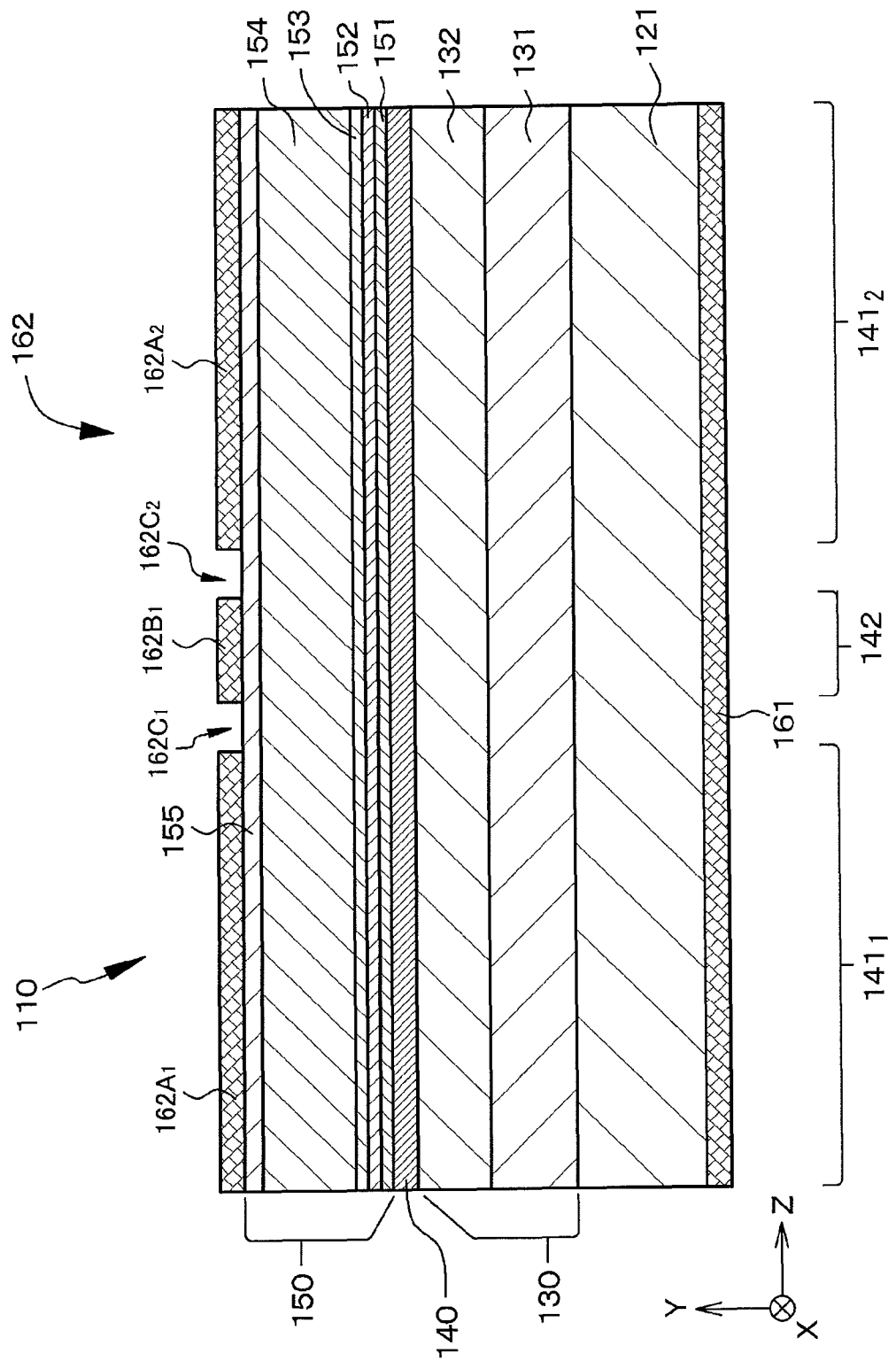
FIG. 16 is a schematic end view taken along a direction in which a resonator of another modification of the mode locking laser diode device in the first example is extended.

The number of the light emitting regions 141 and the saturable absorption regions 142 is not limited to one. FIG. 15 illustrates a schematic end view of a mode locking laser diode device in which one first section 162A of the second electrode and two second sections 162B$_1$ and 162B$_2$ of the second electrode are provided. In the mode locking laser diode device, one end of the first section 162A is opposed to one second section 162B$_1$ with one isolation trench 162 C$_1$ in between, and the other end of the first section 162A is opposed to the other second section 162B$_2$ with the other isolation trench 162C$_2$ in between. Further, one light emitting region 141 is sandwiched between two saturable absorption regions 142$_1$ and 142$_2$. Further, FIG. 16 illustrates a schematic end view of a mode locking laser diode device in which two first sections 162A$_1$ and 162A$_2$ of the second electrode and one second section 162B of the second electrode are provided. In the mode locking laser diode device, an end section of the second section 162B is opposed to one first section 162A$_1$ with one isolation trench 162 C$_1$ in between, and the other end of the second section 162B is opposed to the other first section 162A$_2$ with the other isolation trench 162 C$_2$ in between. Further, one saturable absorption region 142 is sandwiched between two light emitting regions 141$_1$ and 141$_2$.

The present application contains subject matter related to that disclosed in Japanese Priority Patent Application JP 2010-149344 filed in the Japan Patent Office on Jun. 30, 2010, the entire contents of which is hereby incorporated by reference.

It should be understood by those skilled in the art that various modifications, combinations, sub-combinations and alternations may occur depending on design requirements and other factors insofar as they are within the scope of the appended claims or the equivalents thereof.

What is claimed is:

1. A method for aligning a semiconductor optical amplifier configured to optically amplify laser light from a laser light source and output the optically amplified laser light, the method comprising:
adjusting a relative position of the semiconductor optical amplifier with respect to the laser light entering into the semiconductor optical amplifier by applying a given value of current to the semiconductor optical amplifier while the laser light from the laser light source enters the semiconductor optical amplifier so that a voltage applied to the semiconductor optical amplifier is at a maximum, wherein,
the semiconductor optical amplifier includes a first electrode and a second electrode,
the second electrode includes a first section and a second section,
$0.001 \leq \text{LAmp-2/LAmp-1} \leq 0.01$ is satisfied, where a length of the first section is LAmp-1 and a length of the second section is LAmp-2,
light amplification is performed by applying voltage to the first section of the second electrode, and
measurement for position adjustment is performed by applying voltage to the second section of the second electrode.

2. The method of claim 1, further comprising:
readjusting the relative position of the semiconductor optical amplifier with respect to the laser light entering into the semiconductor optical amplifier if light output from the semiconductor amplifier is measured and changed from a desired value by applying the given value of current to the semiconductor optical amplifier while the laser light from the laser light source enters the semiconductor optical amplifier so that the voltage applied to the semiconductor optical amplifier is at the maximum.

3. The method of claim 2, further comprising:
adjusting a light path through which the laser light outputted from the semiconductor optical amplifier passes if a result of the readjustment of the relative position of the semiconductor optical amplifier with respect to the laser light entering into the semiconductor optical amplifier is the same as the relative position of the semiconductor optical amplifier with respect to the laser light entering into the semiconductor optical amplifier before the readjustment.

4. The method of claim 1, wherein the semiconductor optical amplifier includes:
(a) a laminated structure having a first compound semiconductor layer with a first conductivity type and composed of GaN compound semiconductor, a third compound semiconductor layer with a light amplification region composed of GaN compound semiconductor, and a second compound semiconductor layer with a second conductivity type different from the first conductivity type and composed of GaN compound semiconductor,
(b) the second electrode formed on the second compound semiconductor layer, and
(c) the first electrode electrically connected to the first compound semiconductor layer.

5. The method of claim 1, wherein the light output of the laser light outputted from the semiconductor optical amplifier reaches the maximum by adjusting the relative position of the semiconductor optical amplifier with respect to the laser light entering the semiconductor optical amplifier.

6. The method of claim 1, wherein the semiconductor optical amplifier is composed of a transmissive semiconductor optical amplifier.

7. The method of claim 1,
wherein,
the laser light source is composed of a mode locking laser diode device, and
the mode locking laser diode device is configured to output a pulse laser light that enters the semiconductor optical amplifier based on mode locking operation.

8. A method of aligning a semiconductor optical amplifier configured to optically amplify laser light from a laser light source and output the optically amplified laser light, the method comprising:
adjusting a relative position of the semiconductor optical amplifier with respect to the laser light entering into the semiconductor optical amplifier by applying a given value of voltage to the semiconductor optical amplifier while the laser light from the laser light source enters the semiconductor optical amplifier so that a current flowing in the semiconductor optical amplifier is at a maximum; and applying a voltage of −20 to 4 volts both inclusive to the semiconductor optical amplifier to perform measurement for position adjustment, wherein, the semiconductor optical amplifier includes (a) a laminated structure having a first compound semiconductor layer with a first conductivity type and composed of GaN compound semiconductor, a third compound semiconductor layer with a light amplification region composed of GaN compound semiconductor, and a second compound semiconductor layer with a second conductivity type different from the first conductivity type and composed of GaN compound semiconductor, (b) a second electrode formed on the second compound semiconductor layer, and (c) a first electrode electrically connected to the first compound semiconductor layer, the second electrode is composed of a first section and a second section that is (i) provided on a light output end face side of the semiconductor optical amplifier, and (ii) separated from the first section by an isolation trench, the voltage of −20 to 4 volts both inclusive is applied to the second section of the second electrode to perform measurement for position adjustment, and another voltage is applied to the first section of the second electrode to perform light amplification.

9. The method of claim 8, further comprising:

readjusting the relative position of the semiconductor optical amplifier with respect to the laser light entering into the semiconductor optical amplifier if light output from the semiconductor optical amplifier is measured and changed from a desired value by applying the given value of voltage to the semiconductor optical amplifier while the laser light from the laser light source enters the semiconductor optical amplifier so that the current flowing in the semiconductor optical amplifier is at the maximum.

10. The method of claim 9, further comprising:

adjusting a light path through which the laser light outputted from the semiconductor optical amplifier passes if a result of the readjustment of the relative position of the semiconductor optical amplifier with respect to the laser light entering into the semiconductor optical amplifier is the same as the relative position of the semiconductor optical amplifier with respect to the laser light entering into the semiconductor optical amplifier before the readjustment.

11. The method of claim 8, wherein $0.001 \leq \text{LAmp-2}/\text{LAmp-1} \leq 0.01$ is satisfied, where a length of the first section is LAmp-1 and a length of the second section is LAmp-2.

12. The method of claim 8, wherein the voltage applied to the semiconductor optical amplifier is applied to the second section of the second electrode.

13. A light output device comprising:

a laser light source;

a semiconductor optical amplifier configured to (i) optically amplify laser light received from the laser light source, and (ii) output the optically amplified light;

an alignment device configured to adjust a relative position of the semiconductor optical amplifier with respect to the laser light entering into the semiconductor optical amplifier; and a semiconductor optical amplifier control device configured to control operation of the semiconductor optical amplifier, wherein, the laser light source is configured to transmit the laser light to the semiconductor optical amplifier while a given value of current is applied to the semiconductor optical amplifier, the semiconductor optical amplifier control device is configured to monitor a voltage applied to the semiconductor optical amplifier, and the relative position of the semiconductor optical amplifier with respect to the laser light entering into the semiconductor optical amplifier is configured to be adjusted by the alignment device so that the voltage applied to the semiconductor optical amplifier is at a maximum, and resolution of a voltage monitor in the semiconductor optical amplifier control device is 1 millivolt or less.

14. A light output device comprising:

a laser light source;

a semiconductor optical amplifier configured to (i) optically amplify laser light from the laser light source, and (ii) output the optically amplified light;

an alignment device configured to adjust a relative position of the semiconductor optical amplifier with respect to the laser light entering the semiconductor optical amplifier; and a semiconductor optical amplifier control device configured to control operation of the semiconductor optical amplifier, wherein, the laser light source is configured to transmit the laser light to the semiconductor optical amplifier while a given value of voltage is applied to the semiconductor optical amplifier, the semiconductor optical amplifier control device is configured to monitor a current applied to the semiconductor optical amplifier, the relative position of the semiconductor optical amplifier with respect to the laser light entering into the semiconductor optical amplifier is configured to be adjusted by the alignment device so that the current applied to the semiconductor optical amplifier is at a maximum, and resolution of a current monitor in the semiconductor optical amplifier control device is 100 microamperes or less.

* * * * *